United States Patent
Kim et al.

(10) Patent No.: US 9,628,973 B2
(45) Date of Patent: Apr. 18, 2017

(54) APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

(71) Applicant: LG ELECTRONICS INC., Seoul (KR)

(72) Inventors: Woochan Kim, Seoul (KR); Sungryong Hong, Seoul (KR); Woosuk Ko, Seoul (KR); Jaeho Hwang, Seoul (KR); Byounggill Kim, Seoul (KR); Jaehyung Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/454,289

(22) Filed: Aug. 7, 2014

(65) Prior Publication Data

US 2015/0043672 A1 Feb. 12, 2015

Related U.S. Application Data

(60) Provisional application No. 61/863,918, filed on Aug. 9, 2013, provisional application No. 61/870,235, filed on Aug. 27, 2013.

(51) Int. Cl.
*H04B 7/02* (2006.01)
*H04L 1/02* (2006.01)
(Continued)

(52) U.S. Cl.
CPC ......... *H04W 4/22* (2013.01); *H03M 13/1177* (2013.01); *H03M 13/255* (2013.01);
(Continued)

(58) Field of Classification Search
CPC .... H04W 4/22; H04W 76/007; H04N 21/814; H04H 20/59
See application file for complete search history.

(56) References Cited

U.S. PATENT DOCUMENTS

2009/0103649 A1* 4/2009 Vare ............... H04L 5/0064
375/295
2009/0168909 A1* 7/2009 Stadelmeier et al. ...... 375/260
(Continued)

FOREIGN PATENT DOCUMENTS

JP 2013520036 A 5/2013
KR 10-2009-0031326 A 3/2009
(Continued)

OTHER PUBLICATIONS

"ATSC Mobile DTV Standard: A/153 Part 1, ATSC Mobile DTV System (A/153 Part 1:2013)", XP055180233, Advanced Television Systems Committee, Mar. 11, 2013.
(Continued)

*Primary Examiner* — Shuwang Liu
*Assistant Examiner* — Gina McKie
(74) *Attorney, Agent, or Firm* — Dentons US LLP

(57) ABSTRACT

A method and an apparatus for transmitting broadcast signals thereof are disclosed. The method for transmitting broadcast signals includes encoding data of PLPs (Physical Layer Pips); building at least one signal frame by mapping the encoded data of the PLPs; and modulating data in the built signal frame by OFDM (Orthogonal Frequency Division Multiplexing) method and transmitting the broadcast signals having the modulated data.

20 Claims, 27 Drawing Sheets

(51) Int. Cl.

| | | |
|---|---|---|
| *H04W 4/22* | (2009.01) | |
| *H03M 13/11* | (2006.01) | |
| *H03M 13/27* | (2006.01) | |
| *H04B 7/0413* | (2017.01) | |
| *H04L 27/26* | (2006.01) | |
| *H04W 4/06* | (2009.01) | |
| *H03M 13/25* | (2006.01) | |
| *H03M 13/29* | (2006.01) | |
| *H03M 13/00* | (2006.01) | |
| H04L 12/18 | (2006.01) | |
| H03M 13/09 | (2006.01) | |
| H03M 13/15 | (2006.01) | |

(52) U.S. Cl.
 CPC ....... *H03M 13/27* (2013.01); *H03M 13/2792* (2013.01); *H03M 13/2906* (2013.01); *H03M 13/6356* (2013.01); *H03M 13/6362* (2013.01); *H04B 7/0413* (2013.01); *H04L 27/2627* (2013.01); *H04W 4/06* (2013.01); *H03M 13/09* (2013.01); *H03M 13/1165* (2013.01); *H03M 13/152* (2013.01); *H04L 12/189* (2013.01); *H04L 27/2601* (2013.01)

(56) References Cited

U.S. PATENT DOCUMENTS

| | | |
|---|---|---|
| 2010/0330951 A1 | 12/2010 | Chen et al. |
| 2011/0274204 A1 | 11/2011 | Ko et al. |
| 2012/0036529 A1* | 2/2012 | McClenny et al. ............. 725/33 |
| 2012/0122401 A1* | 5/2012 | Aunkofer .......... H04W 52/0229 455/62 |
| 2012/0327879 A1 | 12/2012 | Stadelmeier et al. |
| 2013/0039303 A1 | 2/2013 | Stadelmeier et al. |
| 2014/0185605 A1* | 7/2014 | Oh ........................ H04W 48/16 370/338 |
| 2014/0302822 A1* | 10/2014 | Ye ........................... H04W 4/12 455/412.2 |
| 2015/0071153 A1* | 3/2015 | Hong ..................... H04W 4/22 370/311 |

FOREIGN PATENT DOCUMENTS

| | | |
|---|---|---|
| KR | 20110095353 A | 8/2011 |
| KR | 1020110133439 A | 12/2011 |
| WO | 2009/104931 A2 | 8/2009 |
| WO | 2012/161552 A2 | 11/2012 |

OTHER PUBLICATIONS

DVB: "Implementation guidelines for a second generation digital terrestrial television broadcasting system (DTV-T2)", XP017833412, draft ETSI TR 102 831 V0.10.03, Geneva, Switzerland, Mar. 24, 2010.

* cited by examiner

FIG. 27

```
automatic_tuning_flag                                 : 1 bit
num_EAS_messages                                      : 7 bits
If (automatic_tuning_flag == 0x01) {
  automatic_tuning_info
  (
    automatic_tuning_channel_number                   : 8 bits
    automatic_tuning_DP_id                            : 8 bits
    automatic_tuning_service_id                       : 16 bits
  )
}
For (m=0; m<num_EAS_messages; m++) {
  EAS_message_id                                      : 32 bits
  EAS_IP_version_flag                                 : 1 bit      : IP v4/v6 (32/128 bits IP_address)
  EAS_EAT_indicator                                   : 1 bit
  EAS_IP_indicator                                    : 1 bit      : shall not transmit IP and TS simultaneously within one super frame
  EAS_TS_indicator                                    : 1 bit      : shall not transmit IP and TS simultaneously within one super frame
  EAS_NRT_indicator                                   : 1 bit
  EAS_RT_flag                                         : 1 bit      : replace Normal AV service with RT resource (EAS_IP or EAS_TS Text/Picture/AV/... (EAS_IP_indicator / EAS_TS_indicator))

EAS_message_encoding_type                           : 3 bits
  if (EAS_EAT_indicator == 0x01) {
    EAS_message_length /* N */                        : 12 bits    : needs the constraint on the size of messages in one frame
    EAS_message_bytes()                               : 8*N bits
  }
  if (EAS_IP_indicator == 0x01) {
    DP_id                                             : 8 bits
    IP address                                        : 32/128 bits
    UDP_port_num                                      : 16 bits
  }
  if (EAS_TS_indicator == 0x01) {
    DP_id                                             : 8 bits
    PID                                               : 13/14 bits
  }
  if (EAS_NRT_indicator == 0x01) {
    DP_id                                             : 8 bits
    IP_address                                        : 32/128 bits
    UDP_port_num                                      : 16 bits
  }
}
```

APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

Pursuant to 35 U.S.C. §119(e), this application claims the benefit of U.S. Provisional Applications Nos. 61/863,918, filed on Aug. 9, 2013, and 61/870,235, filed on Aug. 27, 2013, which is hereby incorporated by reference as if fully set forth herein.

BACKGROUND OF THE INVENTION

Field of the Invention

The present invention relates to an apparatus for transmitting broadcast signals, an apparatus for receiving broadcast signals and methods for transmitting and receiving broadcast signals.

Discussion of the Related Art

As analog broadcast signal transmission comes to an end, various technologies for transmitting/receiving digital broadcast signals are being developed. A digital broadcast signal may include a larger amount of video/audio data than an analog broadcast signal and further include various types of additional data in addition to the video/audio data.

That is, a digital broadcast system can provide HD (high definition) images, multi-channel audio and various additional services. However, data transmission efficiency for transmission of large amounts of data, robustness of transmission/reception networks and network flexibility in consideration of mobile reception equipment need to be improved for digital broadcast.

SUMMARY OF THE INVENTION

Accordingly, the present invention is directed to an apparatus for transmitting broadcast signals and an apparatus for receiving broadcast signals for future broadcast services and methods for transmitting and receiving broadcast signals for future broadcast services.

An object of the present invention devised to solve the problem lies on an apparatus and method for transmitting broadcast signals to multiplex data of a broadcast transmission/reception system providing two or more different broadcast services in a time domain and transmit the multiplexed data through the same RF signal bandwidth and an apparatus and method for receiving broadcast signals corresponding thereto.

Another object of the present invention devised to solve the problem lies on an apparatus for transmitting broadcast signals, an apparatus for receiving broadcast signals and methods for transmitting and receiving broadcast signals to classify data corresponding to services by components, transmit data corresponding to each component as a data pipe, receive and process the data Another object of the present invention devised to solve the problem lies on an apparatus for transmitting broadcast signals, an apparatus for receiving broadcast signals and methods for transmitting and receiving broadcast signals to signal signaling information necessary to provide broadcast signals.

The object of the present invention can be achieved by providing a method of transmitting broadcast signals including encoding data of PLPs (Physical Layer Pips), wherein the encoding data of the PLPs further includes, encoding the data of the PLPs with LDPC (Low Density Parity Check) codes, bit interleaving the LDPC encoded data in the PLPs, mapping the bit interleaved data onto constellations, MIMO (Multi Input Multi Output) encoding the mapped data, and time interleaving the MIMO encoded data; building at least one signal frame by mapping the encoded data of the PLPs; and modulating data in the built signal frame by OFDM (Orthogonal Frequency Division Multiplexing) method and transmitting the broadcast signals having the modulated data, wherein the signal frame includes a preamble generated by using an EAS (Emergency Alert System) sequence, wherein the EAS sequence provides signaling about the emergency.

Preferably, the preamble provides a first signaling information to indicate when a receiver in a stand-by mode wakes up.

Preferably, the EAS sequence of the preamble includes the first signaling information.

Preferably, the preamble further includes a second signaling information indicating whether EAS data is provided in the current signal frame, and wherein the EAS data includes information about the emergency.

Preferably, the signal frame further includes physical layer signaling data having signaling information for the data of the PLPs, wherein the physical layer signaling data includes a third signaling information indicating existence of the EAS data in the current signal frame, and wherein the third signaling information has the same value as the second signaling information.

Preferably, the signal frame further includes a version information indicating version of the emergency alert.

In another aspect of the present invention, provided herein is an method of receiving broadcast signals including receiving the broadcast signals having at least one signal frame and demodulating data in the at least one signal frame by OFDM (Orthogonal Frequency Division Multiplexing) method; parsing the at least one signal frame by demapping data of PLPs (Physical Layer Pipes); and decoding the data of the PLPs, wherein the decoding the data of the PLPs further includes, time deinterleaving the data of the PLPs, MIMO (Multi Input Multi Output) decoding the time deinterleaved data of the PLPs, demapping the MIMO decoded data from constellations, bit deinterleaving the demapped data, and decoding the bit deinterleaved data with LDPC (Low Density Parity Check) codes, wherein the signal frame includes a preamble generated by using an EAS (Emergency Alert System) sequence, wherein the EAS sequence provides signaling about the emergency.

Preferably, the preamble provides a first signaling information to indicate when a receiver in a stand-by mode wakes up.

Preferably, the EAS sequence of the preamble includes the first signaling information.

Preferably, the preamble further includes a second signaling information indicating whether EAS data is provided in the current signal frame, and wherein the EAS data includes information about the emergency.

Preferably, the signal frame further includes physical layer signaling data having signaling information for the data of the PLPs, wherein the physical layer signaling data includes a third signaling information indicating existence of the EAS data in the current signal frame, and wherein the third signaling information has the same value as the second signaling information.

Preferably, the signal frame further includes a version information indicating version of the emergency alert.

In another aspect of the present invention, provided herein is an apparatus for transmitting broadcast signals including an encoding module for encoding data of PLPs (Physical Layer Pips), wherein the encoding module further includes, a LDPC (Low Density Parity Check) block for encoding the data of the PLPs with LDPC codes, a bit interleaving block for bit interleaving the LDPC encoded data in the PLPs, a constellation mapping block for mapping the bit interleaved data onto constellations, a MIMO (Multi Input Multi Output) block for MIMO encoding the mapped data, and a time interleaving block for time interleaving the MIMO encoded data; a frame building module for building at least one signal frame by mapping the encoded data of the PLPs; and an OFDM module for modulating data in the built signal frame by OFDM (Orthogonal Frequency Division Multiplexing) method and transmitting the broadcast signals having the modulated data, wherein the signal frame includes a preamble generated by using an EAS (Emergency Alert System) sequence, wherein the EAS sequence provides signaling about the emergency.

Preferably, the preamble provides a first signaling information to indicate when a receiver in a stand-by mode wakes up.

Preferably, the EAS sequence of the preamble includes the first signaling information.

Preferably, the preamble further includes a second signaling information indicating whether EAS data is provided in the current signal frame, and wherein the EAS data includes information about the emergency.

Preferably, the signal frame further includes physical layer signaling data having signaling information for the data of the PLPs, wherein the physical layer signaling data includes a third signaling information indicating existence of the EAS data in the current signal frame, and wherein the third signaling information has the same value as the second signaling information.

Preferably, the signal frame further includes a version information indicating version of the emergency alert.

In another aspect of the present invention, provided herein is an apparatus for receiving broadcast signals including an OFDM module for receiving the broadcast signals having at least one signal frame and demodulating data in the at least one signal frame by OFDM (Orthogonal Frequency Division Multiplexing) method; a frame parsing module for parsing the at least one signal frame by demapping data of PLPs (Physical Layer Pipes); and a decoding module for decoding the data of the PLPs, wherein the decoding module further includes, a time deinterleaving block for time deinterleaving the data of the PLPs, a MIMO (Multi Input Multi Output) decoding block for MIMO decoding the time deinterleaved data of the PLPs, a constellation demapping block for demapping the MIMO decoded data from constellations, a bit deinterleaving block for bit deinterleaving the demapped data, and a LDPC (Low Density Parity Check) block for decoding the bit deinterleaved data with LDPC codes, wherein the signal frame includes a preamble generated by using an EAS (Emergency Alert System) sequence, wherein the EAS sequence provides signaling about the emergency.

Preferably, the preamble provides a first signaling information to indicate when a receiver in a stand-by mode wakes up.

Preferably, the EAS sequence of the preamble includes the first signaling information.

Preferably, the preamble further includes a second signaling information indicating whether EAS data is provided in the current signal frame, and wherein the EAS data includes information about the emergency.

Preferably, the signal frame further includes physical layer signaling data having signaling information for the data of the PLPs, wherein the physical layer signaling data includes a third signaling information indicating existence of the EAS data in the current signal frame, and wherein the third signaling information has the same value as the second signaling information.

Preferably, the signal frame further includes a version information indicating version of the emergency alert.

The present invention can process data according to service characteristics to control QoS for each service or service component, thereby providing various broadcast services.

The present invention can achieve transmission flexibility by transmitting various broadcast services through the same RF signal bandwidth.

The present invention can improve data transmission efficiency and increase robustness of transmission/reception of broadcast signals using a MIMO system.

According to the present invention, it is possible to provide broadcast signal transmission and reception methods and apparatus capable of receiving digital broadcast signals without error even with mobile reception equipment or in an indoor environment.

BRIEF DESCRIPTION OF THE DRAWINGS

The accompanying drawings, which are included to provide a further understanding of the invention, illustrate embodiments of the invention and together with the description serve to explain the principle of the invention.

In the drawings:

FIG. 27 is a view showing EAT information according to an embodiment of the present invention.

DETAILED DESCRIPTION OF THE INVENTION

Reference will now be made in detail to the preferred embodiments of the present invention, examples of which are illustrated in the accompanying drawings. The detailed description, which will be given below with reference to the accompanying drawings, is intended to explain exemplary embodiments of the present invention, rather than to show the only embodiments that can be implemented according to the present invention. The following detailed description includes specific details in order to provide a thorough understanding of the present invention. However, it will be apparent to those skilled in the art that the present invention may be practiced without such specific details.

Although most terms used in the present invention have been selected from general ones widely used in the art, some terms have been arbitrarily selected by the applicant and their meanings are explained in detail in the following description as needed. Thus, the present invention should be understood based upon the intended meanings of the terms rather than their simple names or meanings.

The present invention provides apparatuses and methods for transmitting and receiving broadcast signals for future broadcast services. Future broadcast services according to an embodiment of the present invention include a terrestrial broadcast service, a mobile broadcast service, a UHDTV service, etc.

The apparatuses and methods for transmitting according to an embodiment of the present invention may be categorized into a base profile for the terrestrial broadcast service, a handheld profile for the mobile broadcast service and an advanced profile for the UHDTV service. In this case, the base profile can be used as a profile for both the terrestrial broadcast service and the mobile broadcast service. That is, the base profile can be used to define a concept of a profile which includes the mobile profile. This can be changed according to intention of the designer.

The present invention may process broadcast signals for the future broadcast services through non-MIMO (Multiple Input Multiple Output) or MIMO according to one embodiment. A non-MIMO scheme according to an embodiment of the present invention may include a MISO (Multiple Input Single Output) scheme, a SISO (Single Input Single Output) scheme, etc.

While MISO or MIMO uses two antennas in the following for convenience of description, the present invention is applicable to systems using two or more antennas.

Figure 1:
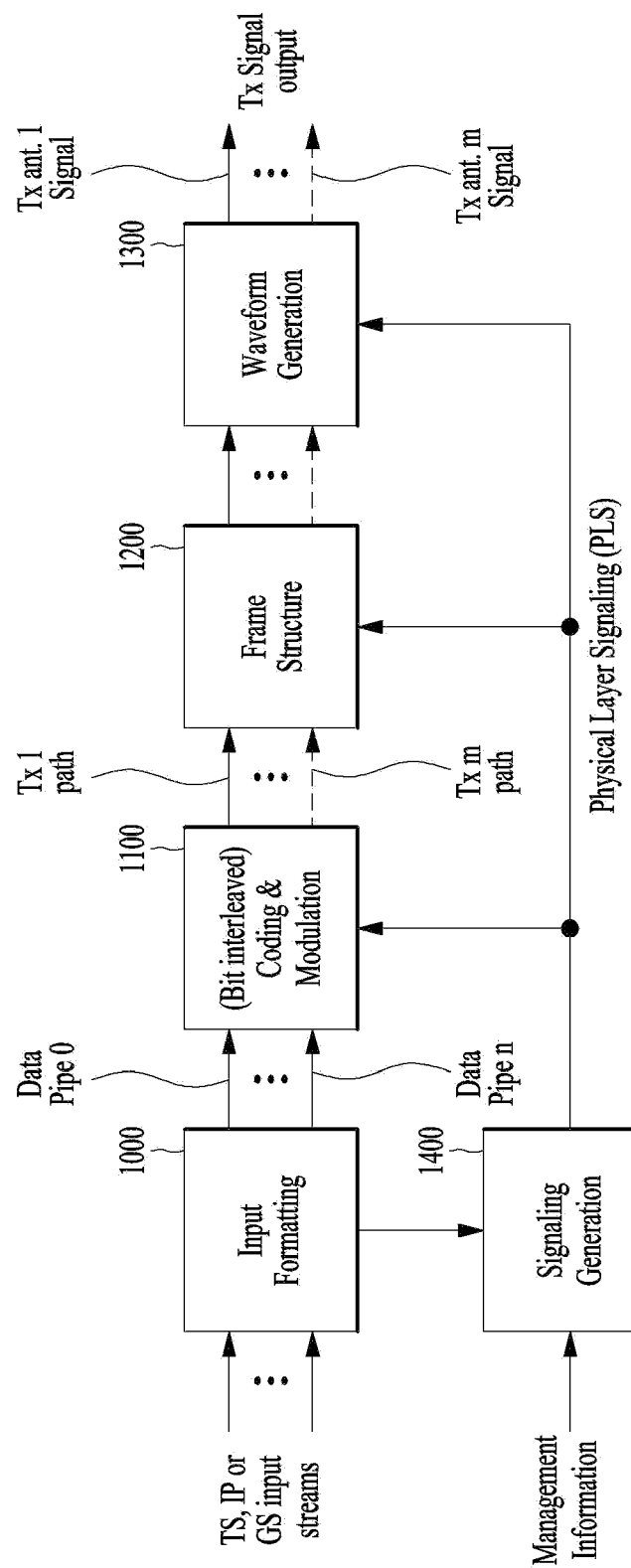
FIG. 1 illustrates a structure of an apparatus for transmitting broadcast signals for future broadcast services according to an embodiment of the present invention.

FIG. 1 illustrates a structure of an apparatus for transmitting broadcast signals for future broadcast services according to an embodiment of the present invention.

The apparatus for transmitting broadcast signals for future broadcast services according to an embodiment of the present invention can include an input formatting module 1000, a coding & modulation module 1100, a frame structure module 1200, a waveform generation module 1300 and a signaling generation module 1400. A description will be given of the operation of each module of the apparatus for transmitting broadcast signals.

Referring to FIG. 1, the apparatus for transmitting broadcast signals for future broadcast services according to an embodiment of the present invention can receive MPEG-TSs, IP streams (v4/v6) and generic streams (GSs) as an input signal. In addition, the apparatus for transmitting broadcast signals can receive management information about the configuration of each stream constituting the input signal and generate a final physical layer signal with reference to the received management information.

The input formatting module 1000 according to an embodiment of the present invention can classify the input streams on the basis of a standard for coding and modulation or services or service components and output the input streams as a plurality of logical data pipes (or data pipes or DP data). The data pipe is a logical channel in the physical layer that carries service data or related metadata, which may carry one or multiple service(s) or service component(s). In addition, data transmitted through each data pipe may be called DP data.

In addition, the input formatting module 1000 according to an embodiment of the present invention can divide each data pipe into blocks necessary to perform coding and modulation and carry out processes necessary to increase transmission efficiency or to perform scheduling. Details of operations of the input formatting module 1000 will be described later.

The coding & modulation module 1100 according to an embodiment of the present invention can perform forward error correction (FEC) encoding on each data pipe received from the input formatting module 1000 such that an apparatus for receiving broadcast signals can correct an error that may be generated on a transmission channel. In addition, the coding & modulation module 1100 according to an embodiment of the present invention can convert FEC output bit data to symbol data and interleave the symbol data to correct burst error caused by a channel. As shown in FIG. 1, the coding & modulation module 1100 according to an embodiment of the present invention can divide the processed data such that the divided data can be output through data paths for respective antenna outputs in order to transmit the data through two or more Tx antennas.

The frame structure module 1200 according to an embodiment of the present invention can map the data output from the coding & modulation module 1100 to signal frames. The frame structure module 1200 according to an embodiment of the present invention can perform mapping using scheduling information output from the input formatting module 1000 and interleave data in the signal frames in order to obtain additional diversity gain.

The waveform generation module 1300 according to an embodiment of the present invention can convert the signal frames output from the frame structure module 1200 into a signal for transmission. In this case, the waveform generation module 1300 according to an embodiment of the present invention can insert a preamble signal (or preamble) into the signal for detection of the transmission apparatus and insert a reference signal for estimating a transmission channel to compensate for distortion into the signal. In addition, the waveform generation module 1300 according to an embodiment of the present invention can provide a guard interval and insert a specific sequence into the same in order to offset the influence of channel delay spread due to multi-path reception. Additionally, the waveform generation module 1300 according to an embodiment of the present invention can perform a procedure necessary for efficient transmission in consideration of signal characteristics such as a peak-to-average power ratio of the output signal.

The signaling generation module 1400 according to an embodiment of the present invention generates final physical layer signaling information using the input management information and information generated by the input formatting module 1000, coding & modulation module 1100 and frame structure module 1200. Accordingly, a reception apparatus according to an embodiment of the present invention can decode a received signal by decoding the signaling information.

As described above, the apparatus for transmitting broadcast signals for future broadcast services according to one embodiment of the present invention can provide terrestrial broadcast service, mobile broadcast service, UHDTV service, etc. Accordingly, the apparatus for transmitting broadcast signals for future broadcast services according to one embodiment of the present invention can multiplex signals for different services in the time domain and transmit the same.

Figure 2:
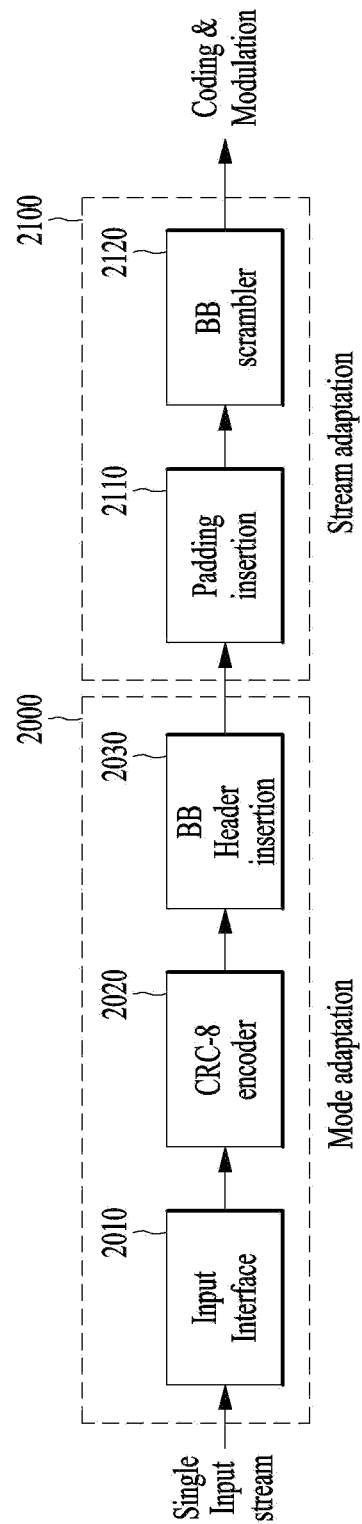
FIG. 2 illustrates an input formatting module according to an embodiment of the present invention.
Figure 3:
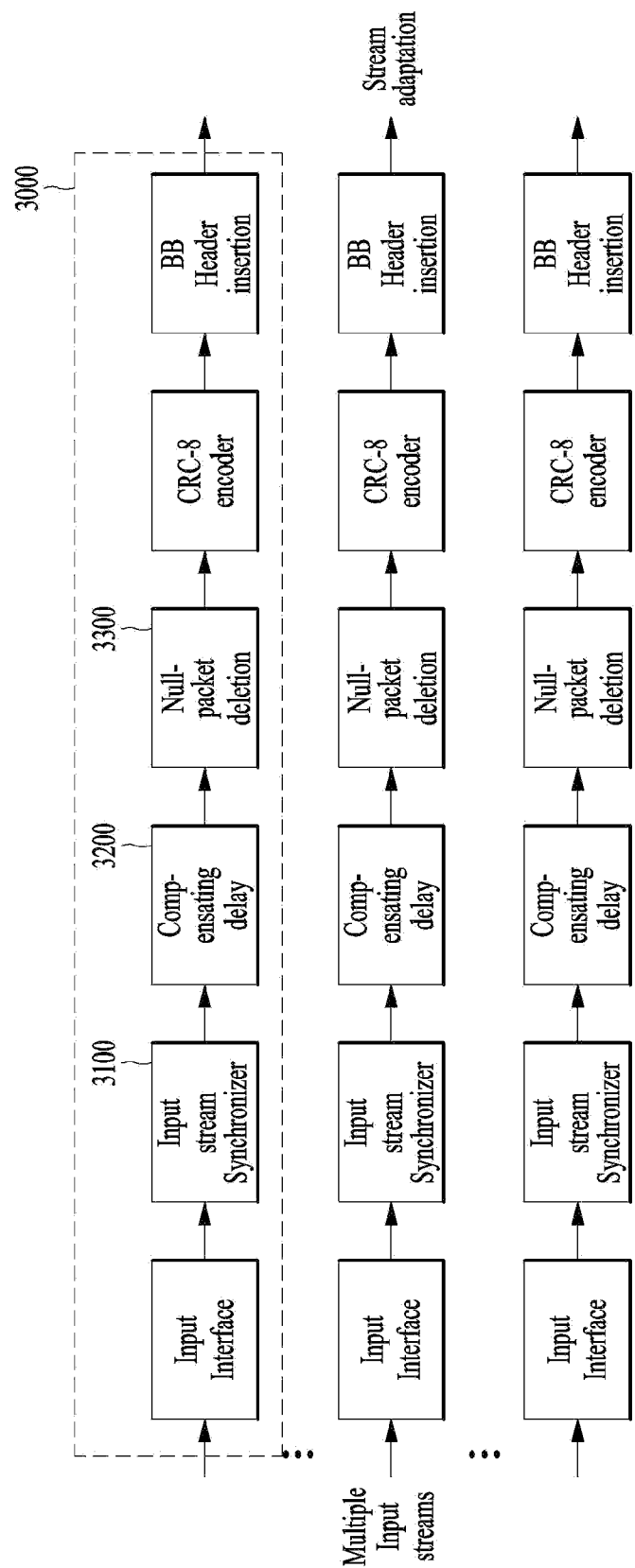
FIG. 3 illustrates an input formatting module according to another embodiment of the present invention.
Figure 4:
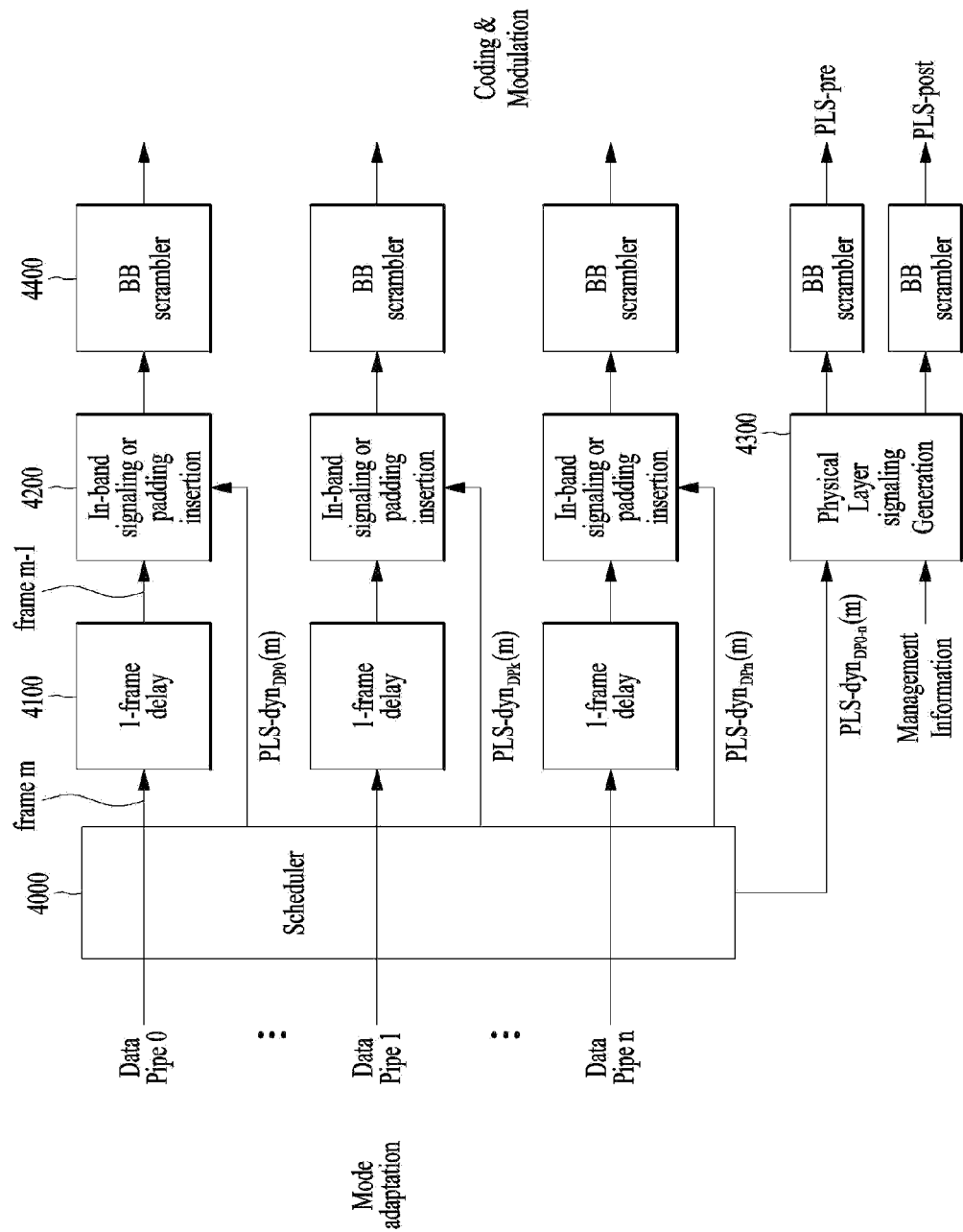
FIG. 4 illustrates an input formatting module according to another embodiment of the present invention.

FIGS. 2, 3 and 4 illustrate the input formatting module 1000 according to embodiments of the present invention. A description will be given of each figure.

FIG. 2 illustrates an input formatting module according to one embodiment of the present invention. FIG. 2 shows an input formatting module when the input signal is a single input stream.

Referring to FIG. 2, the input formatting module according to one embodiment of the present invention can include a mode adaptation module 2000 and a stream adaptation module 2100.

As shown in FIG. 2, the mode adaptation module 2000 can include an input interface block 2010, a CRC-8 encoder block 2020 and a BB header insertion block 2030. Description will be given of each block of the mode adaptation module 2000.

The input interface block 2010 can divide the single input stream input thereto into data pieces each having the length of a baseband (BB) frame used for FEC (BCH/LDPC) which will be performed later and output the data pieces.

The CRC-8 encoder block 2020 can perform CRC encoding on BB frame data to add redundancy data thereto.

The BB header insertion block 2030 can insert, into the BB frame data, a header including information such as mode adaptation type (TS/GS/IP), a user packet length, a data field length, user packet sync byte, start address of user packet sync byte in data field, a high efficiency mode indicator, an input stream synchronization field, etc.

As shown in FIG. 2, the stream adaptation module 2100 can include a padding insertion block 2110 and a BB scrambler block 2120. Description will be given of each block of the stream adaptation module 2100.

If data received from the mode adaptation module 2000 has a length shorter than an input data length necessary for FEC encoding, the padding insertion block 2110 can insert a padding bit into the data such that the data has the input data length and output the data including the padding bit.

The BB scrambler block 2120 can randomize the input bit stream by performing an XOR operation on the input bit stream and a pseudo random binary sequence (PRBS).

The above-described blocks may be omitted or replaced by blocks having similar or identical functions.

As shown in FIG. 2, the input formatting module can finally output data pipes to the coding & modulation module.

FIG. 3 illustrates an input formatting module according to another embodiment of the present invention. FIG. 3 shows a mode adaptation module 3000 of the input formatting module when the input signal corresponds to multiple input streams.

The mode adaptation module 3000 of the input formatting module for processing the multiple input streams can independently process the multiple input streams.

Referring to FIG. 3, the mode adaptation module 3000 for respectively processing the multiple input streams can include input interface blocks, input stream synchronizer blocks 3100, compensating delay blocks 3200, null packet deletion blocks 3300, CRC-8 encoder blocks and BB header insertion blocks. Description will be given of each block of the mode adaptation module 3000.

Operations of the input interface block, CRC-8 encoder block and BB header insertion block correspond to those of the input interface block, CRC-8 encoder block and BB header insertion block described with reference to FIG. 2 and thus description thereof is omitted.

The input stream synchronizer block 3100 can transmit input stream clock reference (ISCR) information to generate timing information necessary for the apparatus for receiving broadcast signals to restore the TSs or GSs.

The compensating delay block 3200 can delay input data and output the delayed input data such that the apparatus for receiving broadcast signals can synchronize the input data if a delay is generated between data pipes according to processing of data including the timing information by the transmission apparatus.

The null packet deletion block 3300 can delete unnecessarily transmitted input null packets from the input data, insert the number of deleted null packets into the input data based on positions in which the null packets are deleted and transmit the input data.

The above-described blocks may be omitted or replaced by blocks having similar or identical functions.

FIG. 4 illustrates an input formatting module according to another embodiment of the present invention.

Specifically, FIG. 4 illustrates a stream adaptation module of the input formatting module when the input signal corresponds to multiple input streams.

The stream adaptation module of the input formatting module when the input signal corresponds to multiple input streams can include a scheduler 4000, a 1-frame delay block 4100, an in-band signaling or padding insertion block 4200, a physical layer signaling generation block 4300 and a BB scrambler block 4400. Description will be given of each block of the stream adaptation module.

The scheduler 4000 can perform scheduling for a MIMO system using multiple antennas having dual polarity. In addition, the scheduler 4000 can generate parameters for use in signal processing blocks for antenna paths, such as a bit-to-cell demux block, a cell interleaver block, a time interleaver block, etc. included in the coding & modulation module illustrated in FIG. 1.

The 1-frame delay block 4100 can delay the input data by one transmission frame such that scheduling information about the next frame can be transmitted through the current frame for in-band signaling information to be inserted into the data pipes.

The in-band signaling or padding insertion block 4200 can insert undelayed physical layer signaling (PLS)-dynamic signaling information into the data delayed by one transmission frame. In this case, the in-band signaling or padding insertion block 4200 can insert a padding bit when a space for padding is present or insert in-band signaling information into the padding space. In addition, the scheduler 4000 can output physical layer signaling-dynamic signaling information about the current frame separately from in-band signaling information. Accordingly, a cell mapper, which will be described later, can map input cells according to scheduling information output from the scheduler 4000.

The physical layer signaling generation block 4300 can generate physical layer signaling data which will be transmitted through a preamble symbol of a transmission frame or spread and transmitted through a data symbol other than the in-band signaling information. In this case, the physical layer signaling data according to an embodiment of the present invention can be referred to as signaling information. Furthermore, the physical layer signaling data according to an embodiment of the present invention can be divided into PLS-pre information and PLS-post information. The PLS-pre information can include parameters necessary to encode the PLS-post information and static PLS signaling data and the PLS-post information can include parameters necessary to encode the data pipes. The parameters necessary to encode the data pipes can be classified into static PLS signaling data and dynamic PLS signaling data. The static PLS signaling data is a parameter commonly applicable to all frames included in a super-frame and can be changed on a super-frame basis. The dynamic PLS signaling data is a parameter differently applicable to respective frames included in a super-frame and can be changed on a frame-by-frame basis. Accordingly, the reception apparatus can acquire the PLS-post information by decoding the PLS-pre information and decode desired data pipes by decoding the PLS-post information.

The BB scrambler block 4400 can generate a pseudo-random binary sequence (PRBS) and perform an XOR operation on the PRBS and the input bit streams to decrease the peak-to-average power ratio (PAPR) of the output signal of the waveform generation block. As shown in FIG. 4, scrambling of the BB scrambler block 4400 is applicable to both data pipes and physical layer signaling information.

The above-described blocks may be omitted or replaced by blocks having similar or identical functions according to designer.

As shown in FIG. 4, the stream adaptation module can finally output the data pipes to the coding & modulation module.

Figure 5:
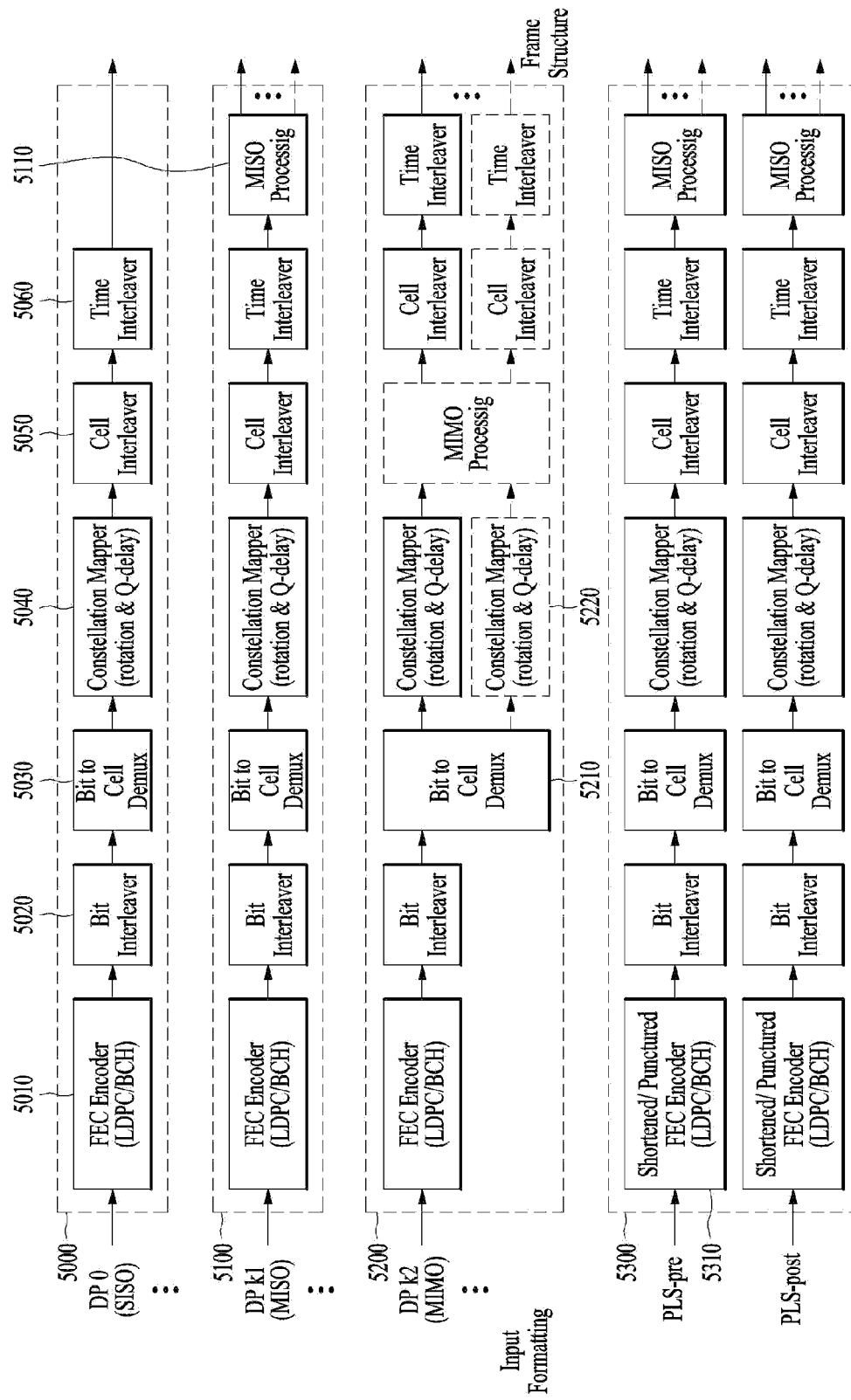
FIG. 5 illustrates a coding & modulation module according to an embodiment of the present invention.

FIG. 5 illustrates a coding & modulation module according to an embodiment of the present invention.

The coding & modulation module shown in FIG. 5 corresponds to an embodiment of the coding & modulation module illustrated in FIG. 1.

As described above, the apparatus for transmitting broadcast signals for future broadcast services according to an embodiment of the present invention can provide a terrestrial broadcast service, mobile broadcast service, UHDTV service, etc.

Since QoS (quality of service) depends on characteristics of a service provided by the apparatus for transmitting broadcast signals for future broadcast services according to an embodiment of the present invention, data corresponding to respective services needs to be processed through different schemes. Accordingly, the coding & modulation module according to an embodiment of the present invention can independently process data pipes input thereto by independently applying SISO, MISO and MIMO schemes to the data pipes respectively corresponding to data paths. Consequently, the apparatus for transmitting broadcast signals for future broadcast services according to an embodiment of the present invention can control QoS for each service or service component transmitted through each data pipe.

Accordingly, the coding & modulation module according to an embodiment of the present invention can include a first block 5000 for SISO, a second block 5100 for MISO, a third block 5200 for MIMO and a fourth block 5300 for processing the PLS-pre/PLS-post information. The coding & modulation module illustrated in FIG. 5 is an exemplary and may include only the first block 5000 and the fourth block 5300, the second block 5100 and the fourth block 5300 or the third block 5200 and the fourth block 5300 according to design. That is, the coding & modulation module can include blocks for processing data pipes equally or differently according to design.

A description will be given of each block of the coding & modulation module.

The first block 5000 processes an input data pipe according to SISO and can include an FEC encoder block 5010, a bit interleaver block 5020, a bit-to-cell demux block 5030, a constellation mapper block 5040, a cell interleaver block 5050 and a time interleaver block 5060.

The FEC encoder block 5010 can perform BCH encoding and LDPC encoding on the input data pipe to add redundancy thereto such that the reception apparatus can correct an error generated on a transmission channel.

The bit interleaver block 5020 can interleave bit streams of the FEC-encoded data pipe according to an interleaving rule such that the bit streams have robustness against burst error that may be generated on the transmission channel. Accordingly, when deep fading or erasure is applied to QAM symbols, errors can be prevented from being generated in consecutive bits from among all codeword bits since interleaved bits are mapped to the QAM symbols.

The bit-to-cell demux block 5030 can determine the order of input bit streams such that each bit in an FEC block can be transmitted with appropriate robustness in consideration of both the order of input bit streams and a constellation mapping rule.

In addition, the bit interleaver block 5020 is located between the FEC encoder block 5010 and the constellation mapper block 5040 and can connect output bits of LDPC encoding performed by the FEC encoder block 5010 to bit positions having different reliability values and optimal values of the constellation mapper in consideration of LDPC decoding of the apparatus for receiving broadcast signals. Accordingly, the bit-to-cell demux block 5030 can be replaced by a block having a similar or equal function.

The constellation mapper block 5040 can map a bit word input thereto to one constellation. In this case, the constellation mapper block 5040 can additionally perform rotation & Q-delay. That is, the constellation mapper block 5040 can rotate input constellations according to a rotation angle, divide the constellations into an in-phase component and a quadrature-phase component and delay only the quadrature-phase component by an arbitrary value. Then, the constellation mapper block 5040 can remap the constellations to new constellations using a paired in-phase component and quadrature-phase component.

In addition, the constellation mapper block 5040 can move constellation points on a two-dimensional plane in order to find optimal constellation points. Through this process, capacity of the coding & modulation module 1100 can be optimized. Furthermore, the constellation mapper block 5040 can perform the above-described operation using IQ-balanced constellation points and rotation. The constellation mapper block 5040 can be replaced by a block having a similar or equal function.

The cell interleaver block 5050 can randomly interleave cells corresponding to one FEC block and output the interleaved cells such that cells corresponding to respective FEC blocks can be output in different orders.

The time interleaver block 5060 can interleave cells belonging to a plurality of FEC blocks and output the interleaved cells. Accordingly, the cells corresponding to the FEC blocks are dispersed and transmitted in a period corresponding to a time interleaving depth and thus diversity gain can be obtained.

The second block 5100 processes an input data pipe according to MISO and can include the FEC encoder block, bit interleaver block, bit-to-cell demux block, constellation mapper block, cell interleaver block and time interleaver block in the same manner as the first block 5000. However, the second block 5100 is distinguished from the first block 5000 in that the second block 5100 further includes a MISO processing block 5110. The second block 5100 performs the same procedure including the input operation to the time interleaver operation as those of the first block 5000 and thus description of the corresponding blocks is omitted.

The MISO processing block 5110 can encode input cells according to a MISO encoding matrix providing transmit diversity and output MISO-processed data through two paths. MISO processing according to one embodiment of the present invention can include OSTBC (orthogonal space time block coding)/OSFBC (orthogonal space frequency block coding, Alamouti coding).

The third block 5200 processes an input data pipe according to MIMO and can include the FEC encoder block, bit interleaver block, bit-to-cell demux block, constellation mapper block, cell interleaver block and time interleaver block in the same manner as the second block 5100, as shown in FIG. 5. However, the data processing procedure of the third block 5200 is different from that of the second block 5100 since the third block 5200 includes a MIMO processing block 5220.

That is, in the third block 5200, basic roles of the FEC encoder block and the bit interleaver block are identical to those of the first and second blocks 5000 and 5100 although functions thereof may be different from those of the first and second blocks 5000 and 5100.

The bit-to-cell demux block 5210 can generate as many output bit streams as input bit streams of MIMO processing and output the output bit streams through MIMO paths for MIMO processing. In this case, the bit-to-cell demux block 5210 can be designed to optimize the decoding performance of the reception apparatus in consideration of characteristics of LDPC and MIMO processing.

Basic roles of the constellation mapper block, cell interleaver block and time interleaver block are identical to those of the first and second blocks 5000 and 5100 although functions thereof may be different from those of the first and second blocks 5000 and 5100. As shown in FIG. 5, as many constellation mapper blocks, cell interleaver blocks and time interleaver blocks as the number of MIMO paths for MIMO processing can be present. In this case, the constellation mapper blocks, cell interleaver blocks and time interleaver blocks can operate equally or independently for data input through the respective paths.

The MIMO processing block 5220 can perform MIMO processing on two input cells using a MIMO encoding matrix and output the MIMO-processed data through two paths. The MIMO encoding matrix according to an embodiment of the present invention can include spatial multiplexing, Golden code, full-rate full diversity code, linear dispersion code, etc.

The fourth block 5300 processes the PLS-pre/PLS-post information and can perform SISO or MISO processing.

The basic roles of the bit interleaver block, bit-to-cell demux block, constellation mapper block, cell interleaver block, time interleaver block and MISO processing block included in the fourth block 5300 correspond to those of the second block 5100 although functions thereof may be different from those of the second block 5100.

A shortened/punctured FEC encoder block 5310 included in the fourth block 5300 can process PLS data using an FEC encoding scheme for a PLS path provided for a case in which the length of input data is shorter than a length necessary to perform FEC encoding. Specifically, the shortened/punctured FEC encoder block 5310 can perform BCH encoding on input bit streams, pad 0s corresponding to a desired input bit stream length necessary for normal LDPC encoding, carry out LDPC encoding and then remove the padded 0s to puncture parity bits such that an effective code rate becomes equal to or lower than the data pipe rate.

The blocks included in the first block 5000 to fourth block 5300 may be omitted or replaced by blocks having similar or identical functions according to design.

As illustrated in FIG. 5, the coding & modulation module can output the data pipes (or DP data), PLS-pre information and PLS-post information processed for the respective paths to the frame structure module.

Figure 6:
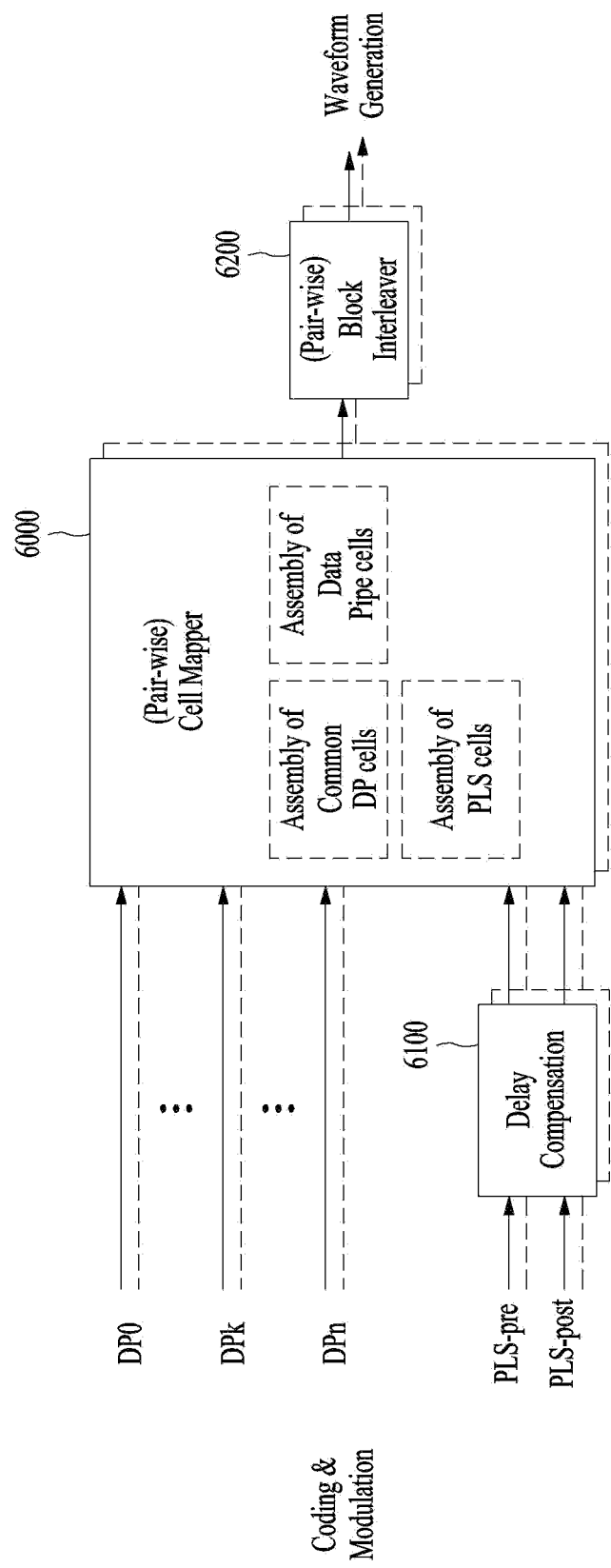
FIG. 6 illustrates a frame structure module according to an embodiment of the present invention.

FIG. 6 illustrates a frame structure module according to one embodiment of the present invention.

The frame structure module shown in FIG. 6 corresponds to an embodiment of the frame structure module 1200 illustrated in FIG. 1.

The frame structure module according to one embodiment of the present invention can include at least one cell-mapper 6000, at least one delay compensation module 6100 and at least one block interleaver 6200. The number of cell mappers 6000, delay compensation modules 6100 and block interleavers 6200 can be changed. A description will be given of each module of the frame structure block.

The cell-mapper 6000 can allocate (or arrange) cells corresponding to SISO-, MISO- or MIMO-processed data pipes output from the coding & modulation module, cells corresponding to common data commonly applicable to the data pipes and cells corresponding to the PLS-pre/PLS-post information to signal frames according to scheduling information. The common data refers to signaling information commonly applied to all or some data pipes and can be transmitted through a specific data pipe. The data pipe through which the common data is transmitted can be referred to as a common data pipe and can be changed according to design.

When the apparatus for transmitting broadcast signals according to an embodiment of the present invention uses two output antennas and Alamouti coding is used for MISO processing, the cell-mapper 6000 can perform pair-wise cell mapping in order to maintain orthogonality according to Alamouti encoding. That is, the cell-mapper 6000 can process two consecutive cells of the input cells as one unit and map (or arrange) the unit to a frame. Accordingly, paired cells in an input path corresponding to an output path of each antenna can be allocated (or arranged) to neighboring positions in a transmission frame.

The delay compensation block 6100 can obtain PLS data corresponding to the current transmission frame by delaying input PLS data cells for the next transmission frame by one frame. In this case, the PLS data corresponding to the current frame can be transmitted through a preamble part in the current signal frame and PLS data corresponding to the next signal frame can be transmitted through a preamble part in the current signal frame or in-band signaling in each data pipe of the current signal frame. This can be changed by the designer.

The block interleaver 6200 can obtain additional diversity gain by interleaving cells in a transport block corresponding to the unit of a signal frame. In addition, the block interleaver 6200 can perform interleaving by processing two consecutive cells of the input cells as one unit when the above-described pair-wise cell mapping is performed. Accordingly, cells output from the block interleaver 6200 can be two consecutive identical cells.

When pair-wise mapping and pair-wise interleaving are performed, at least one cell mapper and at least one block interleaver can operate equally or independently for data input through the paths.

The above-described blocks may be omitted or replaced by blocks having similar or identical functions according to design.

As illustrated in FIG. 6, the frame structure module can output at least one signal frame to the waveform generation module.

Figure 7:
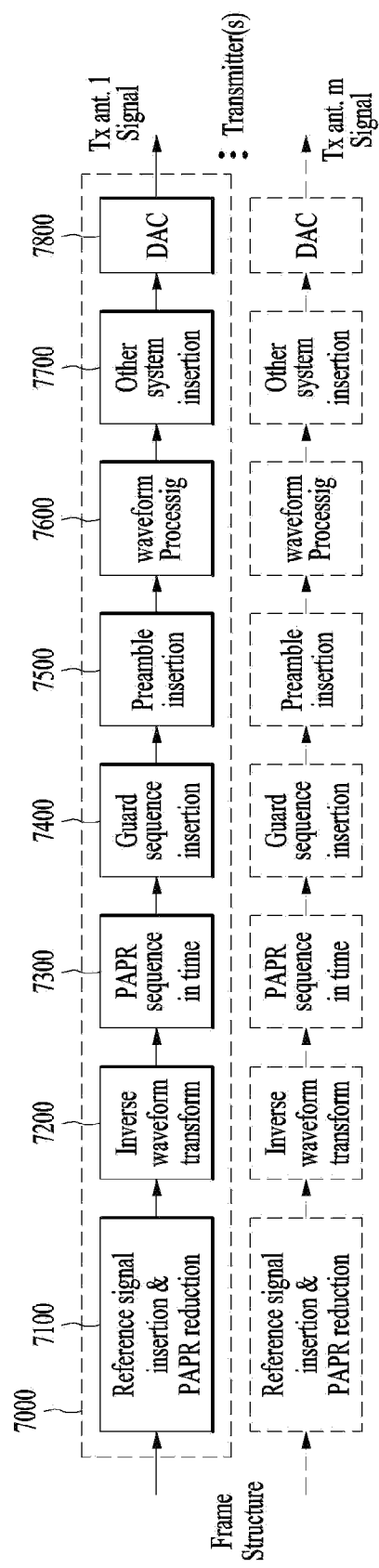
FIG. 7 illustrates a waveform generation module according to an embodiment of the present invention.

FIG. 7 illustrates a waveform generation module according to an embodiment of the present invention.

The waveform generation module illustrated in FIG. 7 corresponds to an embodiment of the waveform generation module 1300 described with reference to FIG. 1.

The waveform generation module according to an embodiment of the present invention can modulate and transmit as many signal frames as the number of antennas for receiving and outputting signal frames output from the frame structure module illustrated in FIG. 6.

Specifically, the waveform generation module illustrated in FIG. 7 is an embodiment of a waveform generation module of an apparatus for transmitting broadcast signals using m Tx antennas and can include m processing blocks for modulating and outputting frames corresponding to m paths. The m processing blocks can perform the same processing procedure. A description will be given of operation of the first processing block 7000 from among the m processing blocks.

The first processing block 7000 can include a reference signal & PAPR reduction block 7100, an inverse waveform transform block 7200, a PAPR reduction in time block 7300, a guard sequence insertion block 7400, a preamble insertion block 7500, a waveform processing block 7600, other system insertion block 7700 and a DAC (digital analog converter) block 7800.

The reference signal insertion & PAPR reduction block 7100 can insert a reference signal into a predetermined position of each signal block and apply a PAPR reduction scheme to reduce a PAPR in the time domain. If a broadcast transmission/reception system according to an embodiment of the present invention corresponds to an OFDM system, the reference signal insertion & PAPR reduction block 7100 can use a method of reserving some active subcarriers rather than using the same. In addition, the reference signal insertion & PAPR reduction block 7100 may not use the PAPR reduction scheme as an optional feature according to broadcast transmission/reception system.

The inverse waveform transform block 7200 can transform an input signal in a manner of improving transmission efficiency and flexibility in consideration of transmission channel characteristics and system architecture. If the broadcast transmission/reception system according to an embodiment of the present invention corresponds to an OFDM system, the inverse waveform transform block 7200 can employ a method of transforming a frequency domain signal into a time domain signal through inverse FFT operation. If the broadcast transmission/reception system according to an embodiment of the present invention corresponds to a single carrier system, the inverse waveform transform block 7200 may not be used in the waveform generation module.

The PAPR reduction in time block 7300 can use a method for reducing PAPR of an input signal in the time domain. If the broadcast transmission/reception system according to an embodiment of the present invention corresponds to an OFDM system, the PAPR reduction in time block 7300 may use a method of simply clipping peak amplitude. Furthermore, the PAPR reduction in time block 7300 may not be used in the broadcast transmission/reception system according to an embodiment of the present invention since it is an optional feature.

The guard sequence insertion block 7400 can provide a guard interval between neighboring signal blocks and insert a specific sequence into the guard interval as necessary in order to minimize the influence of delay spread of a transmission channel. Accordingly, the reception apparatus can easily perform synchronization or channel estimation. If the broadcast transmission/reception system according to an embodiment of the present invention corresponds to an OFDM system, the guard sequence insertion block 7400 may insert a cyclic prefix into a guard interval of an OFDM symbol.

The preamble insertion block 7500 can insert a signal of a known type (e.g. the preamble or preamble symbol) agreed upon between the transmission apparatus and the reception apparatus into a transmission signal such that the reception apparatus can rapidly and efficiently detect a target system signal. If the broadcast transmission/reception system according to an embodiment of the present invention corresponds to an OFDM system, the preamble insertion block 7500 can define a signal frame composed of a plurality of OFDM symbols and insert a preamble symbol into the beginning of each signal frame. That is, the preamble carries basic PLS data and is located in the beginning of a signal frame.

The waveform processing block 7600 can perform waveform processing on an input baseband signal such that the input baseband signal meets channel transmission characteristics. The waveform processing block 7600 may use a method of performing square-root-raised cosine (SRRC) filtering to obtain a standard for out-of-band emission of a transmission signal. If the broadcast transmission/reception system according to an embodiment of the present invention corresponds to a multi-carrier system, the waveform processing block 7600 may not be used.

The other system insertion block 7700 can multiplex signals of a plurality of broadcast transmission/reception systems in the time domain such that data of two or more different broadcast transmission/reception systems providing broadcast services can be simultaneously transmitted in the same RF signal bandwidth. In this case, the two or more different broadcast transmission/reception systems refer to systems providing different broadcast services. The different broadcast services may refer to a terrestrial broadcast service, mobile broadcast service, etc. Data related to respective broadcast services can be transmitted through different frames.

The DAC block 7800 can convert an input digital signal into an analog signal and output the analog signal. The signal output from the DAC block 7800 can be transmitted through m output antennas. A Tx antenna according to an embodiment of the present invention can have vertical or horizontal polarity.

The above-described blocks may be omitted or replaced by blocks having similar or identical functions according to design.

Figure 8:
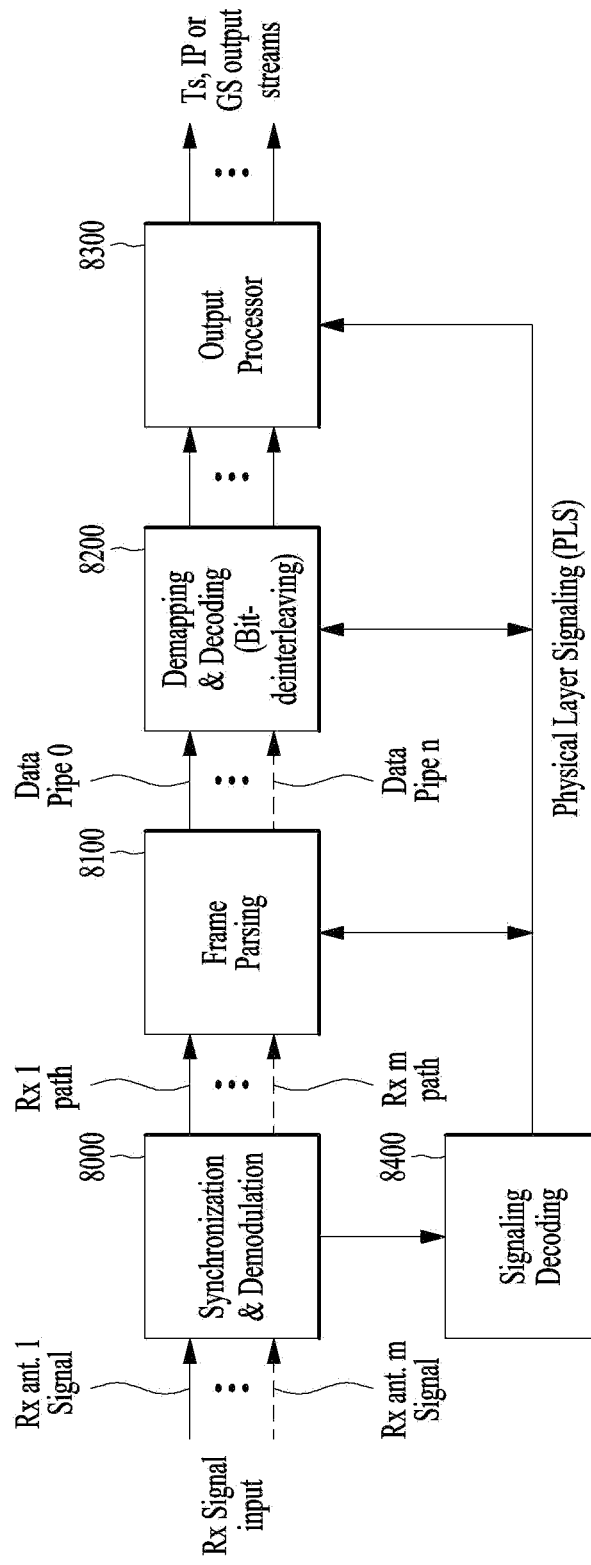
FIG. 8 illustrates a structure of an apparatus for receiving broadcast signals for future broadcast services according to an embodiment of the present invention.

FIG. 8 illustrates a structure of an apparatus for receiving broadcast signals for future broadcast services according to an embodiment of the present invention.

The apparatus for receiving broadcast signals for future broadcast services according to an embodiment of the present invention can correspond to the apparatus for transmitting broadcast signals for future broadcast services, described with reference to FIG. 1. The apparatus for receiving broadcast signals for future broadcast services according to an embodiment of the present invention can include a synchronization & demodulation module 8000, a frame parsing module 8100, a demapping & decoding module 8200, an output processor 8300 and a signaling decoding module 8400. A description will be given of operation of each module of the apparatus for receiving broadcast signals.

The synchronization & demodulation module 8000 can receive input signals through m Rx antennas, perform signal detection and synchronization with respect to a system corresponding to the apparatus for receiving broadcast signals and carry out demodulation corresponding to a reverse procedure of the procedure performed by the apparatus for transmitting broadcast signals.

The frame parsing module 8100 can parse input signal frames and extract data through which a service selected by a user is transmitted. If the apparatus for transmitting broadcast signals performs interleaving, the frame parsing module 8100 can carry out deinterleaving corresponding to a reverse procedure of interleaving. In this case, the positions of a signal and data that need to be extracted can be obtained by decoding data output from the signaling decoding module 8400 to restore scheduling information generated by the apparatus for transmitting broadcast signals.

The demapping & decoding module 8200 can convert the input signals into bit domain data and then deinterleave the same as necessary. The demapping & decoding module 8200 can perform demapping for mapping applied for transmission efficiency and correct an error generated on a transmission channel through decoding. In this case, the demapping & decoding module 8200 can obtain transmission parameters necessary for demapping and decoding by decoding the data output from the signaling decoding module 8400.

The output processor 8300 can perform reverse procedures of various compression/signal processing procedures which are applied by the apparatus for transmitting broadcast signals to improve transmission efficiency. In this case, the output processor 8300 can acquire necessary control information from data output from the signaling decoding module 8400. The output of the output processor 8300 corresponds to a signal input to the apparatus for transmitting broadcast signals and may be MPEG-TSs, IP streams (v4 or v6) and generic streams.

The signaling decoding module 8400 can obtain PLS information from the signal demodulated by the synchronization & demodulation module 8000. As described above, the frame parsing module 8100, demapping & decoding module 8200 and output processor 8300 can execute functions thereof using the data output from the signaling decoding module 8400.

Figure 9:
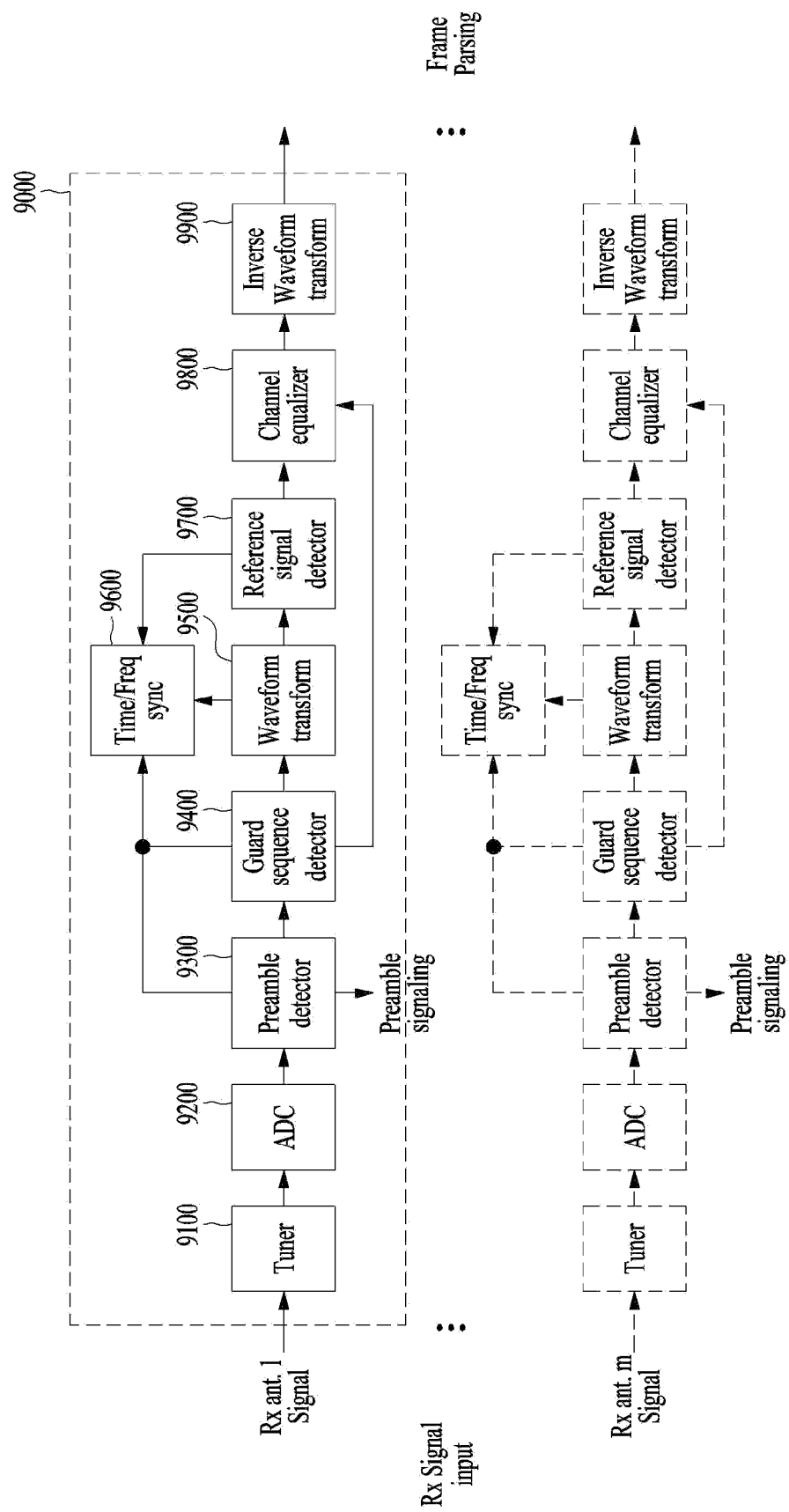
FIG. 9 illustrates a synchronization & demodulation module according to an embodiment of the present invention.

FIG. 9 illustrates a synchronization & demodulation module according to an embodiment of the present invention.

The synchronization & demodulation module shown in FIG. 9 corresponds to an embodiment of the synchronization & demodulation module described with reference to FIG. 8. The synchronization & demodulation module shown in FIG. 9 can perform a reverse operation of the operation of the waveform generation module illustrated in FIG. 7.

As shown in FIG. 9, the synchronization & demodulation module according to an embodiment of the present invention corresponds to a synchronization & demodulation module of an apparatus for receiving broadcast signals using m Rx antennas and can include m processing blocks for demodulating signals respectively input through m paths. The m processing blocks can perform the same processing procedure. A description will be given of operation of the first processing block 9000 from among the m processing blocks.

The first processing block 9000 can include a tuner 9100, an ADC block 9200, a preamble detector 9300, a guard sequence detector 9400, a waveform transform block 9500, a time/frequency synchronization block 9600, a reference signal detector 9700, a channel equalizer 9800 and an inverse waveform transform block 9900.

The tuner 9100 can select a desired frequency band, compensate for the magnitude of a received signal and output the compensated signal to the ADC block 9200.

The ADC block 9200 can convert the signal output from the tuner 9100 into a digital signal.

The preamble detector 9300 can detect a preamble (or preamble signal or preamble symbol) in order to check whether or not the digital signal is a signal of the system corresponding to the apparatus for receiving broadcast signals. In this case, the preamble detector 9300 can decode basic transmission parameters received through the preamble.

The guard sequence detector 9400 can detect a guard sequence in the digital signal.

The time/frequency synchronization block 9600 can perform time/frequency synchronization using the detected guard sequence and the channel equalizer 9800 can estimate a channel through a received/restored sequence using the detected guard sequence.

The waveform transform block 9500 can perform a reverse operation of inverse waveform transform when the apparatus for transmitting broadcast signals has performed inverse waveform transform. When the broadcast transmission/reception system according to one embodiment of the present invention is a multi-carrier system, the waveform transform block 9500 can perform FFT. Furthermore, when the broadcast transmission/reception system according to an embodiment of the present invention is a single carrier system, the waveform transform block 9500 may not be used if a received time domain signal is processed in the frequency domain or processed in the time domain.

The time/frequency synchronization block 9600 can receive output data of the preamble detector 9300, guard sequence detector 9400 and reference signal detector 9700 and perform time synchronization and carrier frequency synchronization including guard sequence detection and block window positioning on a detected signal. Here, the time/frequency synchronization block 9600 can feed back the output signal of the waveform transform block 9500 for frequency synchronization.

The reference signal detector 9700 can detect a received reference signal. Accordingly, the apparatus for receiving broadcast signals according to an embodiment of the present invention can perform synchronization or channel estimation.

The channel equalizer 9800 can estimate a transmission channel from each Tx antenna to each Rx antenna from the guard sequence or reference signal and perform channel equalization for received data using the estimated channel.

The inverse waveform transform block 9900 may restore the original received data domain when the waveform transform block 9500 performs waveform transform for efficient synchronization and channel estimation/equalization. If the broadcast transmission/reception system according to an embodiment of the present invention is a single carrier system, the waveform transform block 9500 can perform FFT in order to carry out synchronization/channel estimation/equalization in the frequency domain and the inverse waveform transform block 9900 can perform IFFT on the channel-equalized signal to restore transmitted data symbols. If the broadcast transmission/reception system according to an embodiment of the present invention is a multi-carrier system, the inverse waveform transform block 9900 may not be used.

The above-described blocks may be omitted or replaced by blocks having similar or identical functions according to design.

Figure 10:
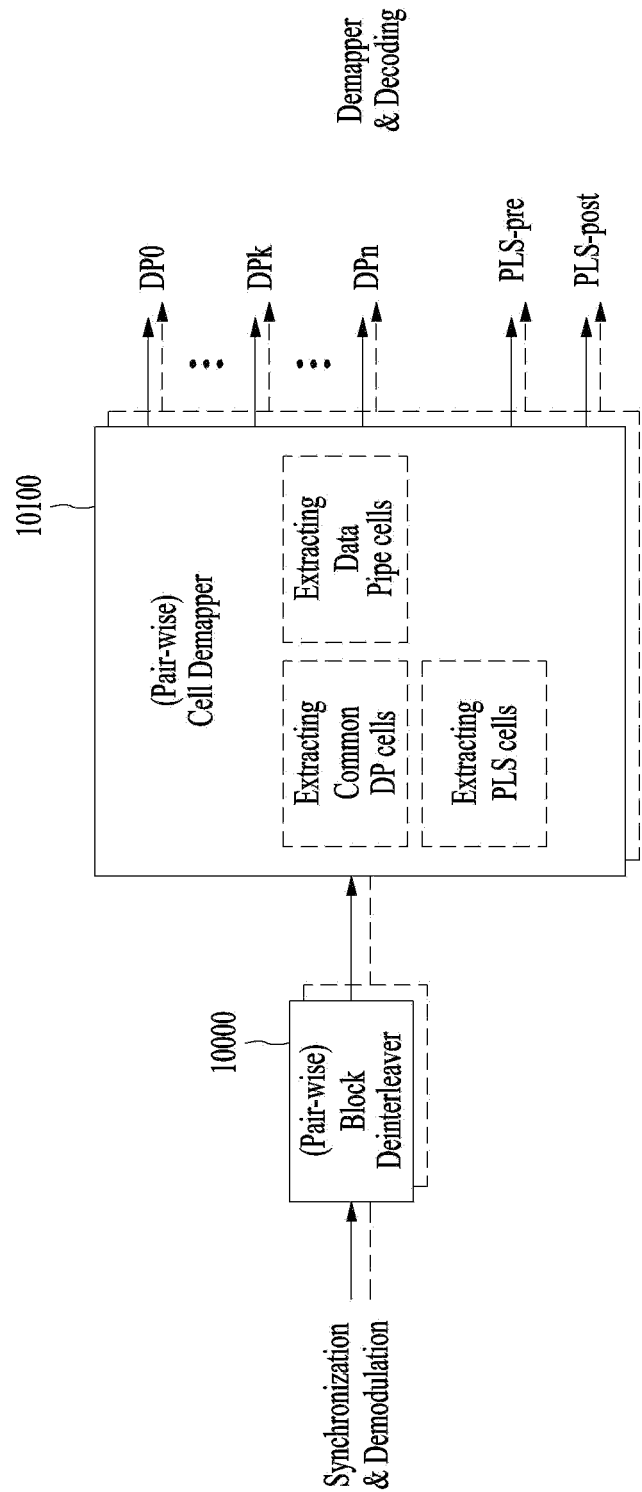
FIG. 10 illustrates a frame parsing module according to an embodiment of the present invention.

FIG. 10 illustrates a frame parsing module according to an embodiment of the present invention.

The frame parsing module illustrated in FIG. 10 corresponds to an embodiment of the frame parsing module described with reference to FIG. 8. The frame parsing module shown in FIG. 10 can perform a reverse operation of the operation of the frame structure module illustrated in FIG. 6.

As shown in FIG. 10, the frame parsing module according to an embodiment of the present invention can include at least one block interleaver 10000 and at least one cell demapper 10100.

The block interleaver 10000 can deinterleave data input through data paths of the m Rx antennas and processed by the synchronization & demodulation module on a signal block basis. In this case, if the apparatus for transmitting broadcast signals performs pair-wise interleaving as illustrated in FIG. 8, the block interleaver 10000 can process two consecutive pieces of data as a pair for each input path. Accordingly, the block interleaver 10000 can output two consecutive pieces of data even when deinterleaving has been performed. Furthermore, the block interleaver 10000 can perform a reverse operation of the interleaving operation performed by the apparatus for transmitting broadcast signals to output data in the original order.

The cell demapper 10100 can extract cells corresponding to common data, cells corresponding to data pipes and cells corresponding to PLS data from received signal frames. The cell demapper 10100 can merge data distributed and transmitted and output the same as a stream as necessary. When two consecutive pieces of cell input data are processed as a pair and mapped in the apparatus for transmitting broadcast signals, as shown in FIG. 6, the cell demapper 10100 can perform pair-wise cell demapping for processing two consecutive input cells as one unit as a reverse procedure of the mapping operation of the apparatus for transmitting broadcast signals.

In addition, the cell demapper 10100 can extract PLS signaling data received through the current frame as PLS-pre & PLS-post data and output the PLS-pre & PLS-post data.

The above-described blocks may be omitted or replaced by blocks having similar or identical functions according to design.

Figure 11:
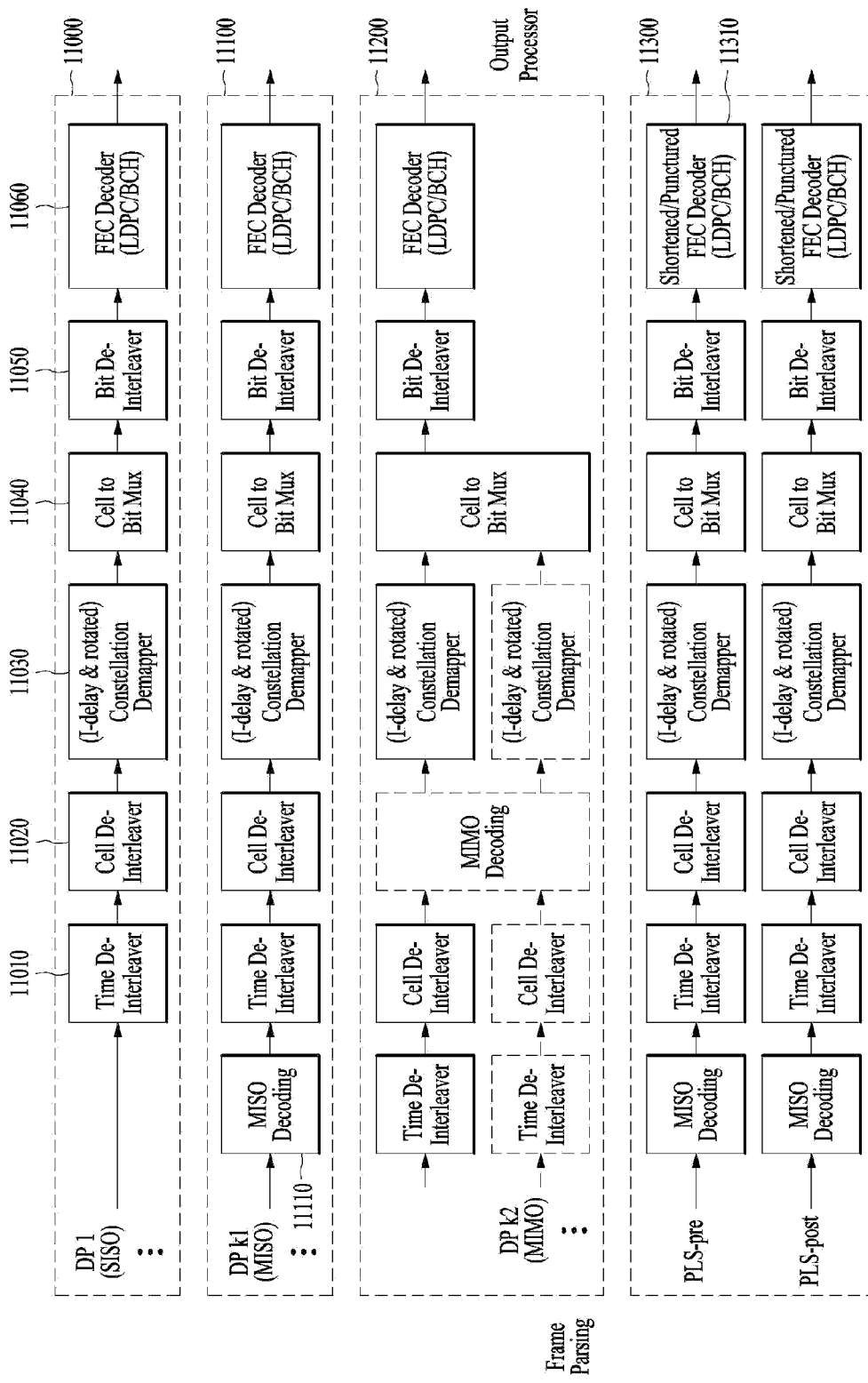
FIG. 11 illustrates a demapping & decoding module according to an embodiment of the present invention.

FIG. 11 illustrates a demapping & decoding module according to an embodiment of the present invention.

The demapping & decoding module shown in FIG. 11 corresponds to an embodiment of the demapping & decoding module illustrated in FIG. 8. The demapping & decoding module shown in FIG. 11 can perform a reverse operation of the operation of the coding & modulation module illustrated in FIG. 5.

The coding & modulation module of the apparatus for transmitting broadcast signals according to an embodiment of the present invention can process input data pipes by independently applying SISO, MISO and MIMO thereto for respective paths, as described above. Accordingly, the demapping & decoding module illustrated in FIG. 11 can include blocks for processing data output from the frame parsing module according to SISO, MISO and MIMO in response to the apparatus for transmitting broadcast signals.

As shown in FIG. 11, the demapping & decoding module according to an embodiment of the present invention can include a first block 11000 for SISO, a second block 11100 for MISO, a third block 11200 for MIMO and a fourth block 11300 for processing the PLS-pre/PLS-post information. The demapping & decoding module shown in FIG. 11 is exemplary and may include only the first block 11000 and the fourth block 11300, only the second block 11100 and the fourth block 11300 or only the third block 11200 and the fourth block 11300 according to design. That is, the demapping & decoding module can include blocks for processing data pipes equally or differently according to design.

A description will be given of each block of the demapping & decoding module.

The first block 11000 processes an input data pipe according to SISO and can include a time deinterleaver block 11010, a cell deinterleaver block 11020, a constellation demapper block 11030, a cell-to-bit mux block 11040, a bit deinterleaver block 11050 and an FEC decoder block 11060.

The time deinterleaver block 11010 can perform a reverse process of the process performed by the time interleaver block 5060 illustrated in FIG. 5. That is, the time deinterleaver block 11010 can deinterleave input symbols interleaved in the time domain into original positions thereof.

The cell deinterleaver block 11020 can perform a reverse process of the process performed by the cell interleaver block 5050 illustrated in FIG. 5. That is, the cell deinterleaver block 11020 can deinterleave positions of cells spread in one FEC block into original positions thereof.

The constellation demapper block 11030 can perform a reverse process of the process performed by the constellation mapper block 5040 illustrated in FIG. 5. That is, the constellation demapper block 11030 can demap a symbol domain input signal to bit domain data. In addition, the constellation demapper block 11030 may perform hard decision and output decided bit data. Furthermore, the constellation demapper block 11030 may output a log-likelihood ratio (LLR) of each bit, which corresponds to a soft decision value or probability value. If the apparatus for transmitting broadcast signals applies a rotated constellation in order to obtain additional diversity gain, the constellation demapper block 11030 can perform 2-dimensional LLR demapping corresponding to the rotated constellation. Here, the constellation demapper block 11030 can calculate the LLR such that a delay applied by the apparatus for transmitting broadcast signals to the I or Q component can be compensated.

The cell-to-bit mux block 11040 can perform a reverse process of the process performed by the bit-to-cell demux block 5030 illustrated in FIG. 5. That is, the cell-to-bit mux block 11040 can restore bit data mapped by the bit-to-cell demux block 5030 to the original bit streams.

The bit deinterleaver block 11050 can perform a reverse process of the process performed by the bit interleaver 5020 illustrated in FIG. 5. That is, the bit deinterleaver block 11050 can deinterleave the bit streams output from the cell-to-bit mux block 11040 in the original order.

The FEC decoder block 11060 can perform a reverse process of the process performed by the FEC encoder block 5010 illustrated in FIG. 5. That is, the FEC decoder block 11060 can correct an error generated on a transmission channel by performing LDPC decoding and BCH decoding.

The second block 11100 processes an input data pipe according to MISO and can include the time deinterleaver block, cell deinterleaver block, constellation demapper block, cell-to-bit mux block, bit deinterleaver block and FEC decoder block in the same manner as the first block 11000, as shown in FIG. 11. However, the second block 11100 is distinguished from the first block 11000 in that the second block 11100 further includes a MISO decoding block 11110. The second block 11100 performs the same procedure including time deinterleaving operation to outputting operation as the first block 11000 and thus description of the corresponding blocks is omitted.

The MISO decoding block 11110 can perform a reverse operation of the operation of the MISO processing block 5110 illustrated in FIG. 5. If the broadcast transmission/reception system according to an embodiment of the present invention uses STBC, the MISO decoding block 11110 can perform Alamouti decoding.

The third block 11200 processes an input data pipe according to MIMO and can include the time deinterleaver block, cell deinterleaver block, constellation demapper block, cell-to-bit mux block, bit deinterleaver block and FEC decoder block in the same manner as the second block 11100, as shown in FIG. 11. However, the third block 11200 is distinguished from the second block 11100 in that the third block 11200 further includes a MIMO decoding block 11210. The basic roles of the time deinterleaver block, cell deinterleaver block, constellation demapper block, cell-to-bit mux block and bit deinterleaver block included in the third block 11200 are identical to those of the corresponding blocks included in the first and second blocks 11000 and 11100 although functions thereof may be different from the first and second blocks 11000 and 11100.

The MIMO decoding block 11210 can receive output data of the cell deinterleaver for input signals of the m Rx antennas and perform MIMO decoding as a reverse operation of the operation of the MIMO processing block 5220 illustrated in FIG. 5. The MIMO decoding block 11210 can perform maximum likelihood decoding to obtain optimal decoding performance or carry out sphere decoding with reduced complexity. Otherwise, the MIMO decoding block 11210 can achieve improved decoding performance by performing MMSE detection or carrying out iterative decoding with MMSE detection.

The fourth block 11300 processes the PLS-pre/PLS-post information and can perform SISO or MISO decoding. The fourth block 11300 can carry out a reverse process of the process performed by the fourth block 5300 described with reference to FIG. 5.

The basic roles of the time deinterleaver block, cell deinterleaver block, constellation demapper block, cell-to-bit mux block and bit deinterleaver block included in the fourth block 11300 are identical to those of the corresponding blocks of the first, second and third blocks 11000, 11100 and 11200 although functions thereof may be different from the first, second and third blocks 11000, 11100 and 11200.

The shortened/punctured FEC decoder 11310 included in the fourth block 11300 can perform a reverse process of the process performed by the shortened/punctured FEC encoder block 5310 described with reference to FIG. 5. That is, the shortened/punctured FEC decoder 11310 can perform de-shortening and de-puncturing on data shortened/punctured according to PLS data length and then carry out FEC decoding thereon. In this case, the FEC decoder used for data pipes can also be used for PLS. Accordingly, additional FEC decoder hardware for the PLS only is not needed and thus system design is simplified and efficient coding is achieved.

The above-described blocks may be omitted or replaced by blocks having similar or identical functions according to design.

The demapping & decoding module according to an embodiment of the present invention can output data pipes and PLS information processed for the respective paths to the output processor, as illustrated in FIG. 11.

Figure 12:
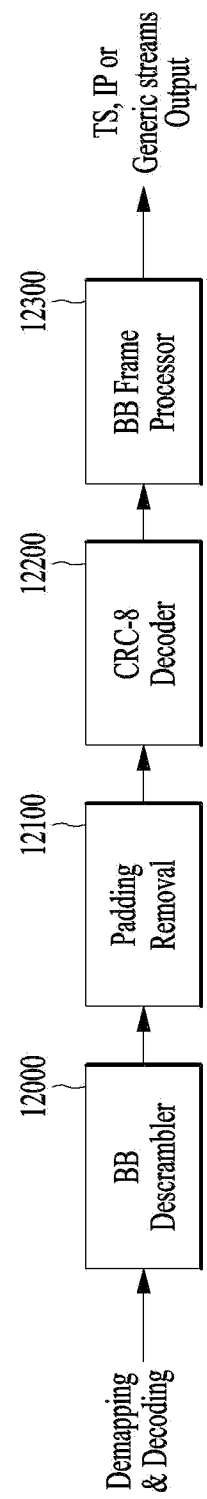
FIG. 12 illustrates an output processor according to an embodiment of the present invention.
Figure 13:
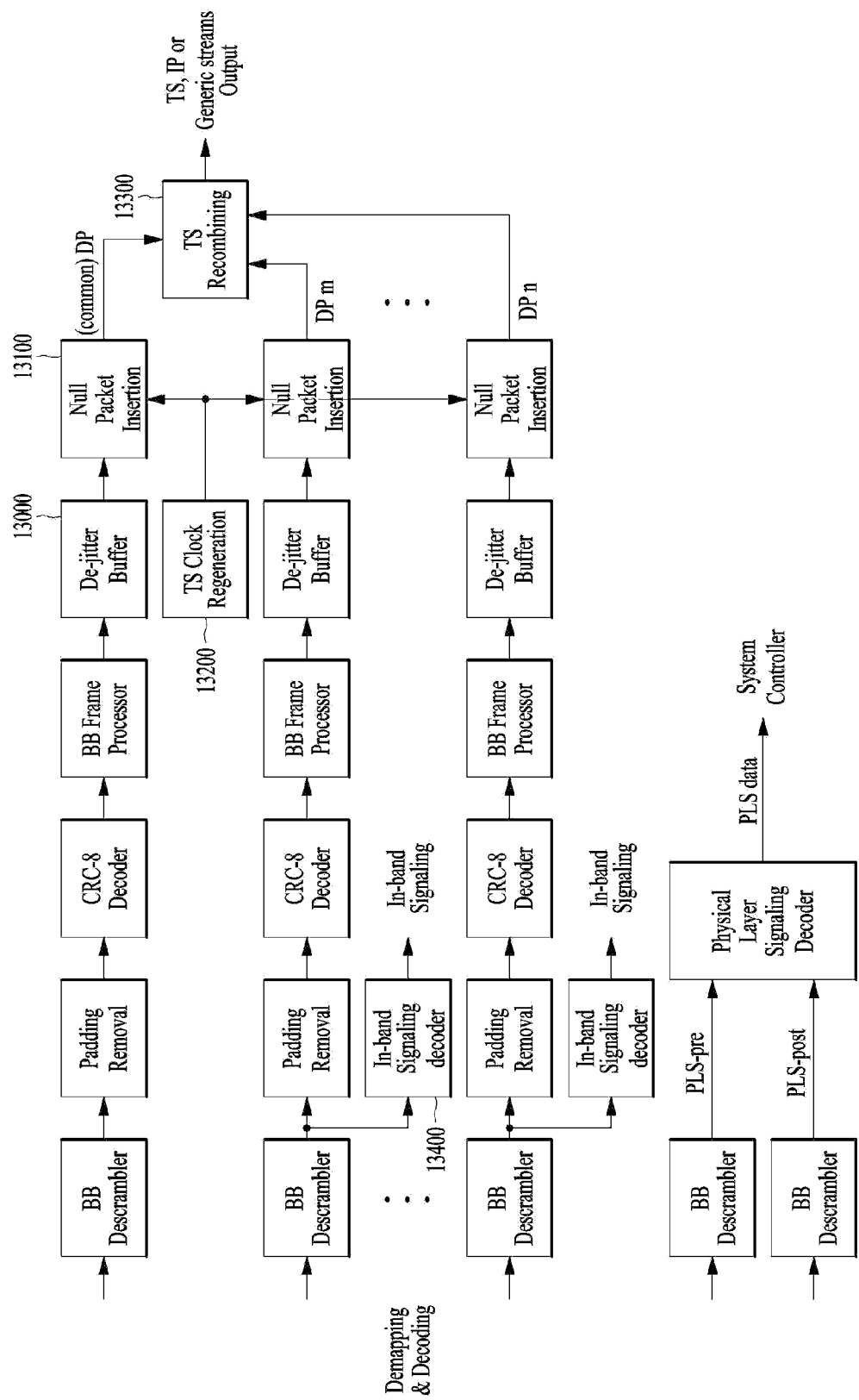
FIG. 13 illustrates an output processor according to another embodiment of the present invention.

FIGS. 12 and 13 illustrate output processors according to embodiments of the present invention.

FIG. 12 illustrates an output processor according to an embodiment of the present invention. The output processor illustrated in FIG. 12 corresponds to an embodiment of the output processor illustrated in FIG. 8. The output processor illustrated in FIG. 12 receives a single data pipe output from the demapping & decoding module and outputs a single output stream. The output processor can perform a reverse operation of the operation of the input formatting module illustrated in FIG. 2.

The output processor shown in FIG. 12 can include a BB scrambler block 12000, a padding removal block 12100, a CRC-8 decoder block 12200 and a BB frame processor block 12300.

The BB scrambler block 12000 can descramble an input bit stream by generating the same PRBS as that used in the apparatus for transmitting broadcast signals for the input bit stream and carrying out an XOR operation on the PRBS and the bit stream.

The padding removal block 12100 can remove padding bits inserted by the apparatus for transmitting broadcast signals as necessary.

The CRC-8 decoder block 12200 can check a block error by performing CRC decoding on the bit stream received from the padding removal block 12100.

The BB frame processor block 12300 can decode information transmitted through a BB frame header and restore MPEG-TSs, IP streams (v4 or v6) or generic streams using the decoded information.

The above-described blocks may be omitted or replaced by blocks having similar or identical functions according to design.

FIG. 13 illustrates an output processor according to another embodiment of the present invention. The output processor shown in FIG. 13 corresponds to an embodiment of the output processor illustrated in FIG. 8. The output processor shown in FIG. 13 receives multiple data pipes output from the demapping & decoding module. Decoding multiple data pipes can include a process of merging common data commonly applicable to a plurality of data pipes and data pipes related thereto and decoding the same or a process of simultaneously decoding a plurality of services or service components (including a scalable video service) by the apparatus for receiving broadcast signals.

The output processor shown in FIG. 13 can include a BB descrambler block, a padding removal block, a CRC-8 decoder block and a BB frame processor block as the output processor illustrated in FIG. 12. The basic roles of these blocks correspond to those of the blocks described with reference to FIG. 12 although operations thereof may differ from those of the blocks illustrated in FIG. 12.

A de-jitter buffer block 13000 included in the output processor shown in FIG. 13 can compensate for a delay, inserted by the apparatus for transmitting broadcast signals for synchronization of multiple data pipes, according to a restored TTO (time to output) parameter.

A null packet insertion block 13100 can restore a null packet removed from a stream with reference to a restored DNP (deleted null packet) and output common data.

A TS clock regeneration block 13200 can restore time synchronization of output packets based on ISCR (input stream time reference) information.

A TS recombining block 13300 can recombine the common data and data pipes related thereto, output from the null packet insertion block 13100, to restore the original MPEG-TSs, IP streams (v4 or v6) or generic streams. The TTO, DNT and ISCR information can be obtained through the BB frame header.

An in-band signaling decoding block 13400 can decode and output in-band physical layer signaling information transmitted through a padding bit field in each FEC frame of a data pipe.

The output processor shown in FIG. 13 can BB-descramble the PLS-pre information and PLS-post information respectively input through a PLS-pre path and a PLS-post path and decode the descrambled data to restore the original PLS data. The restored PLS data is delivered to a system controller included in the apparatus for receiving broadcast signals. The system controller can provide parameters necessary for the synchronization & demodulation module, frame parsing module, demapping & decoding module and output processor module of the apparatus for receiving broadcast signals.

The above-described blocks may be omitted or replaced by blocks having similar r identical functions according to design.

Figure 14:
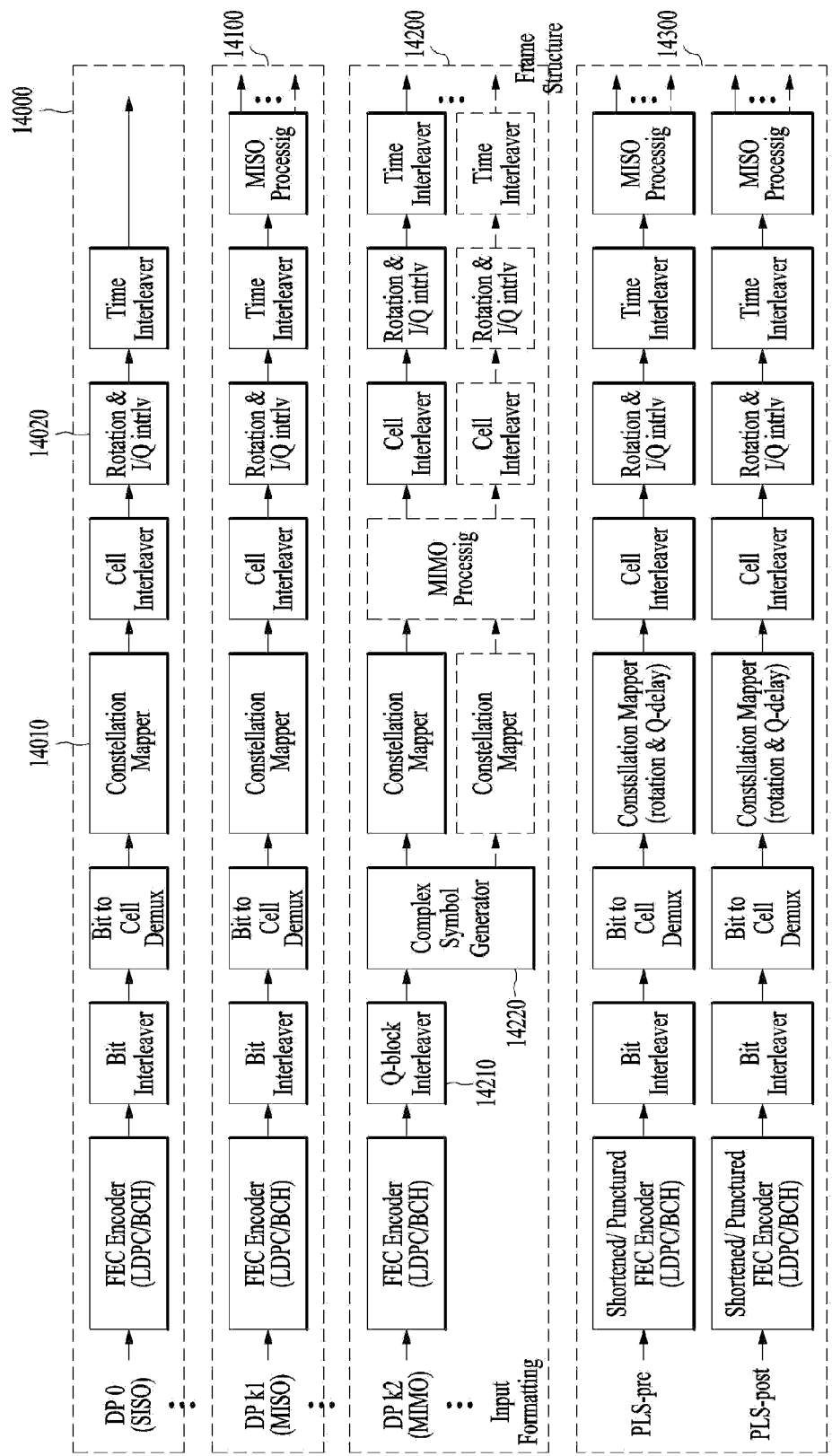
FIG. 14 illustrates a coding & modulation module according to another embodiment of the present invention.

FIG. 14 illustrates a coding & modulation module according to another embodiment of the present invention.

The coding & modulation module shown in FIG. 14 corresponds to another embodiment of the coding & modulation module illustrated in FIGS. 1 to 5.

To control QoS for each service or service component transmitted through each data pipe, as described above with reference to FIG. 5, the coding & modulation module shown in FIG. 14 can include a first block 14000 for SISO, a second block 14100 for MISO, a third block 14200 for MIMO and a fourth block 14300 for processing the PLS-pre/PLS-post information. In addition, the coding & modulation module can include blocks for processing data pipes equally or differently according to the design. The first to fourth blocks 14000 to 14300 shown in FIG. 14 are similar to the first to fourth blocks 5000 to 5300 illustrated in FIG. 5.

However, the first to fourth blocks 14000 to 14300 shown in FIG. 14 are distinguished from the first to fourth blocks 5000 to 5300 illustrated in FIG. 5 in that a constellation mapper 14010 included in the first to fourth blocks 14000 to 14300 has a function different from the first to fourth blocks 5000 to 5300 illustrated in FIG. 5, a rotation & I/Q interleaver block 14020 is present between the cell interleaver and the time interleaver of the first to fourth blocks 14000 to 14300 illustrated in FIG. 14 and the third block 14200 for MIMO has a configuration different from the third block 5200 for MIMO illustrated in FIG. 5. The following description focuses on these differences between the first to fourth blocks 14000 to 14300 shown in FIG. 14 and the first to fourth blocks 5000 to 5300 illustrated in FIG. 5.

The constellation mapper block 14010 shown in FIG. 14 can map an input bit word to a complex symbol. However, the constellation mapper block 14010 may not perform constellation rotation, differently from the constellation mapper block shown in FIG. 5. The constellation mapper block 14010 shown in FIG. 14 is commonly applicable to the first, second and third blocks 14000, 14100 and 14200, as described above.

The rotation & I/Q interleaver block 14020 can independently interleave in-phase and quadrature-phase components of each complex symbol of cell-interleaved data output from the cell interleaver and output the in-phase and quadrature-phase components on a symbol-by-symbol basis. The number of number of input data pieces and output data pieces of the rotation & I/Q interleaver block 14020 is two or more which can be changed by the designer. In addition, the rotation & I/Q interleaver block 14020 may not interleave the in-phase component.

The rotation & I/Q interleaver block 14020 is commonly applicable to the first to fourth blocks 14000 to 14300, as described above. In this case, whether or not the rotation & I/Q interleaver block 14020 is applied to the fourth block 14300 for processing the PLS-pre/post information can be signaled through the above-described preamble.

The third block 14200 for MIMO can include a Q-block interleaver block 14210 and a complex symbol generator block 14220, as illustrated in FIG. 14.

The Q-block interleaver block 14210 can permute a parity part of an FEC-encoded FEC block received from the FEC encoder. Accordingly, a parity part of an LDPC H matrix can be made into a cyclic structure like an information part. The Q-block interleaver block 14210 can permute the order of output bit blocks having Q size of the LDPC H matrix and then perform row-column block interleaving to generate final bit streams.

The complex symbol generator block 14220 receives the bit streams output from the Q-block interleaver block 14210, maps the bit streams to complex symbols and outputs the complex symbols. In this case, the complex symbol generator block 14220 can output the complex symbols through at least two paths. This can be modified by the designer.

The above-described blocks may be omitted or replaced by blocks having similar or identical functions according to design.

The coding & modulation module according to another embodiment of the present invention, illustrated in FIG. 14, can output data pipes, PLS-pre information and PLS-post information processed for respective paths to the frame structure module.

Figure 15:
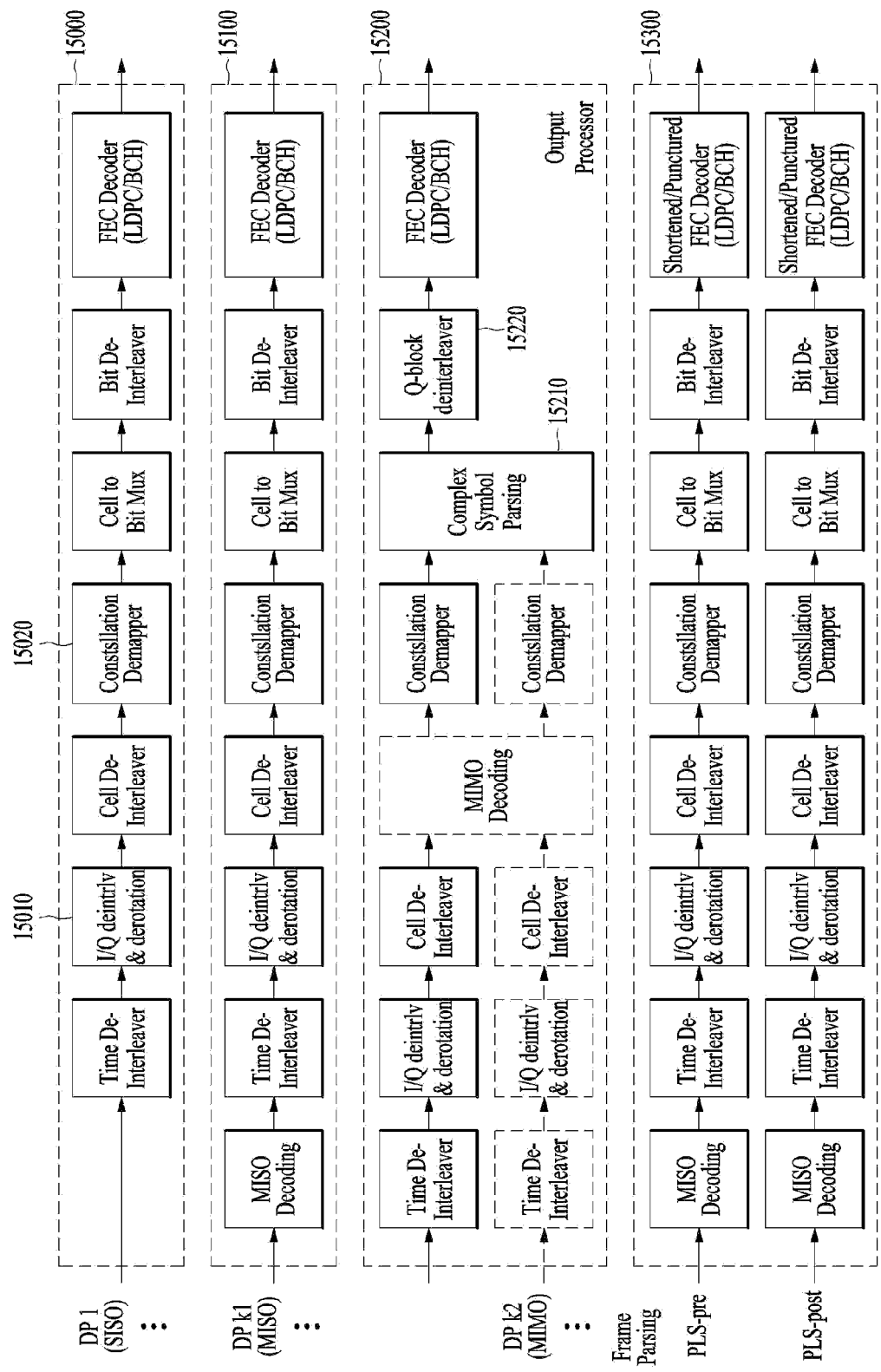
FIG. 15 illustrates a demapping & decoding module according to another embodiment of the present invention.

FIG. 15 illustrates a demapping & decoding module according to another embodiment of the present invention.

The demapping & decoding module shown in FIG. 15 corresponds to another embodiment of the demapping & decoding module illustrated in FIG. 11. The demapping & decoding module shown in FIG. 15 can perform a reverse operation of the operation of the coding & modulation module illustrated in FIG. 14.

As shown in FIG. 15, the demapping & decoding module according to another embodiment of the present invention can include a first block 15000 for SISO, a second block 11100 for MISO, a third block 15200 for MIMO and a fourth block 14300 for processing the PLS-pre/PLS-post information. In addition, the demapping & decoding module can include blocks for processing data pipes equally or differently according to design. The first to fourth blocks 15000 to 15300 shown in FIG. 15 are similar to the first to fourth blocks 11000 to 11300 illustrated in FIG. 11.

However, the first to fourth blocks 15000 to 15300 shown in FIG. 15 are distinguished from the first to fourth blocks 11000 to 11300 illustrated in FIG. 11 in that an I/Q deinterleaver and derotation block 15010 is present between the time interleaver and the cell deinterleaver of the first to fourth blocks 15000 to 15300, a constellation mapper 15010 included in the first to fourth blocks 15000 to 15300 has a function different from the first to fourth blocks 11000 to 11300 illustrated in FIG. 11 and the third block 15200 for MIMO has a configuration different from the third block 11200 for MIMO illustrated in FIG. 11. The following description focuses on these differences between the first to fourth blocks 15000 to 15300 shown in FIG. 15 and the first to fourth blocks 11000 to 11300 illustrated in FIG. 11.

The I/Q deinterleaver & derotation block 15010 can perform a reverse process of the process performed by the rotation & I/Q interleaver block 14020 illustrated in FIG. 14. That is, the I/Q deinterleaver & derotation block 15010 can deinterleave I and Q components I/Q-interleaved and transmitted by the apparatus for transmitting broadcast signals and derotate complex symbols having the restored I and Q components.

The I/Q deinterleaver & derotation block 15010 is commonly applicable to the first to fourth blocks 15000 to 15300, as described above. In this case, whether or not the I/Q deinterleaver & derotation block 15010 is applied to the fourth block 15300 for processing the PLS-pre/post information can be signaled through the above-described preamble.

The constellation demapper block 15020 can perform a reverse process of the process performed by the constellation mapper block 14010 illustrated in FIG. 14. That is, the constellation demapper block 15020 can demap cell-deinterleaved data without performing derotation.

The third block 15200 for MIMO can include a complex symbol parsing block 15210 and a Q-block deinterleaver block 15220, as shown in FIG. 15.

The complex symbol parsing block 15210 can perform a reverse process of the process performed by the complex symbol generator block 14220 illustrated in FIG. 14. That is, the complex symbol parsing block 15210 can parse complex data symbols and demap the same to bit data. In this case, the complex symbol parsing block 15210 can receive complex data symbols through at least two paths.

The Q-block deinterleaver block 15220 can perform a reverse process of the process carried out by the Q-block interleaver block 14210 illustrated in FIG. 14. That is, the Q-block deinterleaver block 15220 can restore Q size blocks according to row-column deinterleaving, restore the order of permuted blocks to the original order and then restore positions of parity bits to original positions according to parity deinterleaving.

The above-described blocks may be omitted or replaced by blocks having similar or identical functions according to design.

As illustrated in FIG. 15, the demapping & decoding module according to another embodiment of the present invention can output data pipes and PLS information processed for respective paths to the output processor.

As described above, the apparatus and method for transmitting broadcast signals according to an embodiment of the present invention can multiplex signals of different broadcast transmission/reception systems within the same RF channel and transmit the multiplexed signals and the apparatus and method for receiving broadcast signals according to an embodiment of the present invention can process the signals in response to the broadcast signal transmission operation. Accordingly, it is possible to provide a flexible broadcast transmission and reception system.

Figure 16:
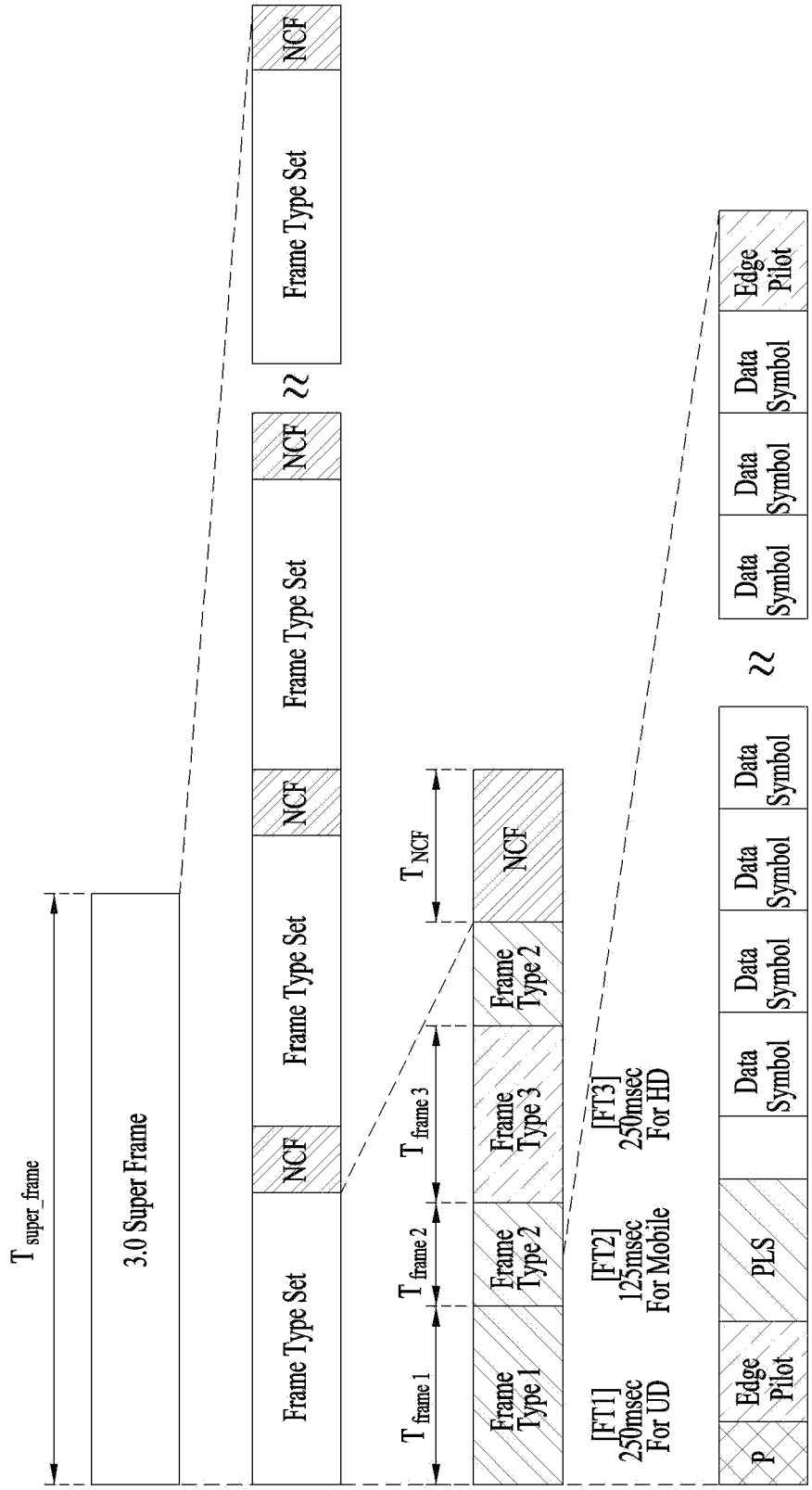
FIG. 16 is a view showing the structure of a frame according to an embodiment of the present invention.

FIG. 16 is a view showing the structure of a frame according to an embodiment of the present invention.

The uppermost unit of the frame may be a Super Frame. The Super Frame may have a length of $T_{super\_frame}$. The super frame may include a predetermined number of Frame Type Sets and/or Next Coming Frames (NCFs). The number of the Frame Type Sets in the Super Frame may be changed according to embodiments of the present invention. In a case in which the Super Frame has one Frame Type Set, the Super Frame may have the same structure as the Frame Type Set. Each NCF may include arbitrary broadcasting or communication signals other than predetermined frame types.

Each Frame Type Set may be a unit including NCF and various defined frame types. In this embodiment, it is assumed that each Frame Type Set includes three frame types. According to embodiments of the present invention, each Frame Type Set may be referred to as a frame repetition unit (FRU). Each Frame Type Set may include a combination of several types of frames. In this drawing, frame types 1, 2, and 3 are suggested. In one embodiment, frame types 1, 2, and 3 may correspond to Ultra high Definition (UD), Mobile, and High Definition (HD) frames, respectively. Frames corresponding to the respective frame types may be changed according to embodiments of the present invention. According to embodiments of the present invention, the first may be a frame based on a Base profile, the second may be a frame based on a Handheld/mobile profile, and the third may be a Future Extended Frame (FEF). The number of the frames in each Frame Type Set may be changed according to embodiments of the present invention. According to embodiments of the present invention, each Frame Type Set may be regarded as a Super Frame.

Each frame type is shown in the lowermost part of this drawing. Each frame type may be referred to as a frame. Each frame type includes a preamble (P), an Edge Pilot, Physical Layer Signaling (PLS), Data symbols, and/or the last Edge Pilot. A preamble indicating the start of a frame may be located at the front of the frame. According to embodiments of the present invention, this preamble may be referred to as P1. P1 may recognize the type of a current frame. That is, P1 may distinguish between a current frame and another frame. In addition, P1 may transmit basic transmission (TX) parameters. According to embodiments of the present invention, P1 may be used for frequency and/or time synchronization. The preamble may include basic information regarding the structure of the frame.

An EAS transmission scheme suggested by the present invention proposes a method of transmitting an EAS signal using the structure of the frame, the Frame Type Set, and/or the Super Frame as previously described.

Figure 17:
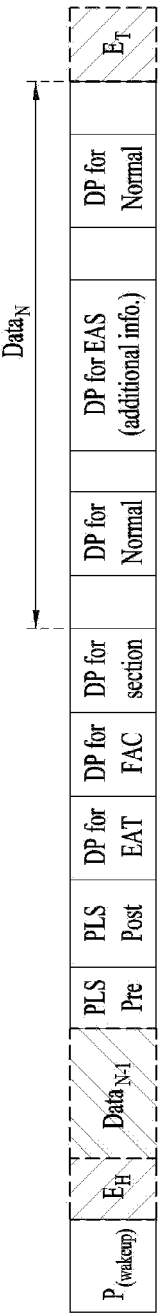
FIG. 17 is a view showing the structure of a frame for EAS transmission according to an embodiment of the present invention.

FIG. 17 is a view showing the structure of a frame for EAS transmission according to an embodiment of the present invention.

The frame for EAS transmission according to the embodiment of the present invention may include $P_{(wakeup)}$, $E_H$, PLS-pre/post, DP for EAT, DP for FAC, DP for section, DP for Normal, DP for EAS, DP for NRT, and/or $E_T$. EAS may mean Emergency Alert System. DP, which is a Data Pipe, may be a logical channel of a physical layer to transmit service data, etc. DP may be a concept similar to a Physical Layer Pipe (PLP). According to embodiments of the present invention, each part of the frame may be omitted. PLS-pre and PLS-post may also be referred to as PLS1 and PLS2, respectively.

According to embodiments of the present invention, the respective elements of the frame as previously described may be omitted or replaced by other elements. The respective elements of the frame may be replaced by other elements that perform the same/similar operations according to embodiments of the present invention. According to embodiments of the present invention, the respective elements of the frame may be referred to as other names. In addition, the positions of the respective elements in the frame may be changed according to embodiments of the present invention.

$P_{(wakeup)}$ may indicate a preamble of the frame. The preamble may include preamble data and a scramble sequence. The scramble sequence may include a single arbitrary sequence or a combination of a plurality of arbitrary sequences. The scramble sequence may also be referred to as a scrambling sequence. According to embodiments of the present invention, wake_up_indicator or EAT_flag may be transmitted using the scrambling sequence or the preamble data. EAT_flag may also be referred to as EAC_flag. EAT_flag may be located in the preamble and PLS-pre according to embodiments of the present invention. In addition, EAT_flag may be located in the preamble and PLS-post according to embodiments of the present invention.

$E_H$ may be a symbol put in a head of the frame. $E_H$ may transmit known data for various kinds of synchronization. $E_H$ may correspond to the above-described edge pilot. $Data_{N-1}$ may be a region to transmit a signal for a general service. According to embodiments of the present invention, $E_H$ and/or $Data_{N-1}$ may be omitted. According to embodiments of the present invention, the position of $Data_{N-1}$ in the frame may be changed. According to embodiments of the present invention, $Data_{N-1}$ may be located in a data region to transmit a signal for a general service. According to embodiments of the present invention, data of $Data_{N-1}$ may be located in a region indicated as a $Data_N$ to transmit a signal for a general service. According to embodiments of the present invention, signals, such as EAS, other than a signal for a general service may be located in a region of $Data_{N-1}$ such that the signals can be transmitted.

PLS-pre/post may transmit information related to a frame or a Super Frame. Control information related to EAS transmission may also be transmitted through PLS-pre/post.

DP for EAT may transmit an emergency alert message and/or additional information related to the EAS. According to embodiments of the present invention, DP for EAT may transit EAT, which will hereinafter be described. That is, the emergency alert message and/or the additional information related to the EAS may have a form of the EAT. The emergency alert message may be a core text message or a table, such as a CAP table. The CAP table may mean a table containing Common Alerting Protocol (CAP) information. CAP may mean a general alert format informing the general public or user of all kinds of risk. CAP may mean a general alert format informing the general public of risk over all kinds of network. CAP may be used together with another alert system. CAP may provide a template for effective alert message transmission. CAP information may be transmitted together with a general service by a service provider. At this time, the CAP information may be filtered and transmitted by the service provider according to embodiments of the present invention. The additional information related to the EAS may means information related to the emergency alert message. In addition, DP for EAT may be used to transmit control information regarding the additional information related to EAS. The control information may mean a flag signal regarding whether the additional information is present or information regarding which DP has the additional information. The control information may include information regarding which DP contains information related to EAS, i.e. which DP is DP for EAS or DP for NRT (ID information of corresponding DP). In addition, the control information may include type information regarding which type DP related to EAS is of. In addition, in a case in which DP or the logical channel containing the information related to EAS is located in a frame/super frame other than the corresponding frame, the control information may include indication information indicating the frame/super frame according to embodiments of the present invention. The control information may include general information to control information related to EAS. The configuration of the control information may be changed according to embodiments of the present invention. According to embodiments of the present invention, DP for EAT may be referred to as an Emergency Alert Channel (EAC).

DP for Fast Acquisition Channel (FAC) may be DP to rapidly transmit information regarding a transmission service. DP for FAC may be referred to as a Fast Information Channel (FIC). FIC, which is a logical channel of the frame, may transmit a service and mapping information between DPs related to the service. That is, FIC may include kinds of services, the number of services, and DP information to be decoded to decode each service. Rapid channel scanning and rapid data reception may be performed through FIC. According to embodiments of the present invention, FIC may be transmitted as a channel independent of PLS or may be transmitted to a data region through signaling of PLS.

DP for section may be DP to transmit all service information regarding the entirety of a transmission service. The service information may include service signaling data, metadata for services, information regarding which DP has information regarding what service/service component, Quality of Service (QoS) information of each service, service capacity information at a given bandwidth, service information such as audio/video, a service map table (SMT), locality information of each service, and/or acquisition information of each service. That is, DP for section may be a channel that is capable of containing overall and total information related to services. DP for section may be omitted according to embodiments of the present invention.

DP for normal may be DP to transmit data of a general service. In this embodiment, the general service may mean general service data having no connection with EAS. DP for normal may be referred to as DP or PLP as previously described. DP, which is a logical channel of a physical layer, may include service data, such as audio/video and a caption, and metadata related thereto. DP for normal may transmit data for a single service/service component or a plurality of services/service components.

DP for EAS may be DP to transmit additional information regarding EAS. As previously described, EAC may have flag information indicating that additional information regarding EAS is present or control information indicating which DP is DP for EAS. The control information has been previously described when describing DP for EAT. The additional information indicated by EAC may be transmitted through DP for EAS. The additional information transmitted through DP for EAS may include a core text message or a CAP table which has not been completely transmitted through EAC. The additional information may include real information regarding an emergency indicated by EAC. That is, the additional information may include total information regarding disaster (an earthquake, a typhoon, etc.) corresponding to an emergency, a level of the emergency, a place influenced by the emergency, behavior protocols to be taken by users or the general public to cope with the emergency, expected start time of the emergency, and expected end time of the emergency. The information may be configured by a service provider or an entity related to emergency control. Which information will be included may be also changed based on the type of the emergency, a situation, and/or intention of a designer. According to embodiments of the present invention, DP for EAS may be used to transmit the additional information regarding EAS in real time (RT).

DP for NRT may be DP used to transmit additional information regarding EAS in non real time (NRT). According to embodiments of the present invention, DP for NRT may be omitted. The additional information regarding EAS transmitted through DP for NRT may be similar to the additional information regarding EAS transmitted through DP for EAS as previously described. DP for NRT may be different in a transmission method from DP for EAS. Since the additional information regarding EAS transmitted through DP for NRT may be used for transmission in NRT, DP for NRT may include time information regarding when the information is utilized. According to embodiments of the present invention, the time information may be achieved in a signaling logical channel of the corresponding frame other than DP for NRT.

$E_T$ is located at the end of the frame and may include a known signal. Consequently, $E_T$ may be used for various kinds of synchronization and channel estimation achieved until the last of the frame. $E_T$ may correspond to the edge pilot as previously described. According to embodiments of the present invention, $E_T$ may be omitted. According to embodiments of the present invention, the position of $E_T$ in the frame may be changed.

When an EAS message is provided in a state in which a receiver is in an off state or in a standby mode, it is necessary for the receiver to automatically receive the EAS message and to provide the received EAS message to a user. A flag, such as wake_up_indicator, may be used such that the receiver in this state can inform the user of the EAS message. In the present invention, wake_up_indicator may be transmitted through a scramble sequence of a preamble $P_{(wakeup)}$. The scramble sequence may be an arbitrary sequence. According to embodiments of the present invention, on the other hand, wake_up_indicator may be transmitted as a flag of a data region of the preamble.

EAS information may be transmitted by a special DP. The EAS information may mean information transmitting an EAS message and/or information related to EAS. The EAS information may have a form of a table which may be referred to as an emergency alert table (EAT). The special DP transmitting the EAS information may be referred to as DP for EAT. As previously described, DP for EAT may be referred to as EAC. DP for EAT may be located after PLS-post. In addition, in a case in which DP for FAC or DP for section is present, DP for EAT may be located before the two DPs.

DP for EAT may have independent MODCOD. MODCOD may mean a modulation order (MOD) and a code rate (COD).

COD of DP for EAT may mean a code rate and configuration mode of FEC. COD of DP for EAT may be based on the same mode as PLS-post. According to embodiments of the present invention, COD of DP for EAT may correspond to the addition of an additional AP to the mode of PLS-post. AP may mean additional parity, which may be used to strengthen robustness.

MOD of DP for EAT may use the most robust MOD value of BPSK or the respective profiles as previously described. The respective profiles may mean a base profile and an advanced profile. According to embodiments of the present invention, any arbitrary MOD may be used. According to embodiments of the present invention, MOD, such as PLS-post, may be provided.

DP for EAT and/or DP related to EAS (for example, DP for EAS, DP for NRT, etc.) as previously described may have the following characteristics in the frame type set or the super frame.

The profiles for the three frame types as previously described may include a base profile, a handheld profile, and/or an advanced profile. An EAS signal/information transmitted through each profile may be processed independently of EAS signals/information transmitted through the other profiles.

First, a preamble may include a normal preamble and a robust preamble. The robust preamble may be a preamble having higher detection and decoding performances than the normal preamble.

The preamble and MODCOD of EAT used to transmit EAS may be as follows. MODCOD of EAT may be defined for each profile, i.e. the base/handheld profile/advanced profile. At this time, the respective profiles may not support the same MODCOD. However, all of the profiles may support a robust EAS mode. The robust EAS mode may be transmission using the robust preamble and robust EAT (DP). The robust EAS mode may support more robust reception. EAT may mean DP for EAT.

Figure 18:
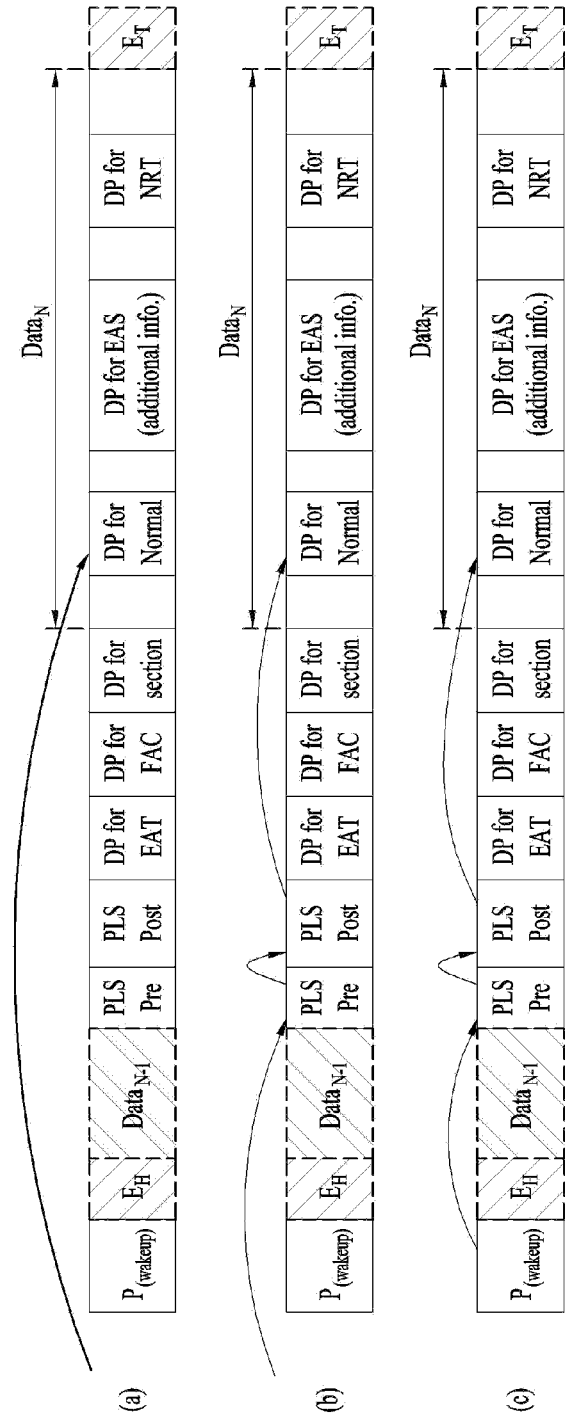
FIG. 18 is a view showing a data processing sequence of a general service according to an embodiment of the present invention.

FIG. 18 is a view showing a data processing sequence of a general service according to an embodiment of the present invention.

The data processing sequence shown in FIG. 18(*a*) may be a data processing sequence of a general service when the receiver knows overall configuration information of the super frame. In a case in which the receiver knows overall configuration information of the super frame, it is possible for the receiver to receive DP for normal without processing PLS or the preamble. DP for normal may be DP for a general service as previously described.

The data processing sequence shown in FIG. 18(*b*) may be a data processing sequence of a general service when configuration information of the super frame known by the receiver is incorrect or erroneous. In addition, the data processing sequence shown in FIG. 18(*b*) may be a data processing sequence in a case in which it is not necessary to detect the preamble through continuous decoding. That is, in a case in which the receiver knows overall configuration information of the super frame through the previous frame, it is possible to decode PLS-pre first without processing the preamble. In addition, even in a case in which the previous frame includes information regarding the current frame and, therefore, it is not necessary to sense (detect) the preamble although overall configuration information of the super frame is not known, the data processing sequence may be based on the data processing sequence shown in FIG. 18(*b*). In this case, PLS-pre may be decoded first and then PLS-post may be decoded using the decoded PLS-pre. DP for normal may be received using frame structure information obtained by decoding PLS-post.

The data processing sequence shown in FIG. 18(*c*) may be a data processing sequence of a general service during an acquisition process. In this case, it may be necessary to acquire the preamble unlike the cases as previously described. That is, data processing may be performed according to the data processing sequence shown in FIG. 18(*c*) in a case in which the receiver is turned on, information regarding the preamble has not obtained from the previous frame, overall configuration of the super frame is not known, or configuration information of the super frame is incorrect or erroneous. The receiver may detect the preamble first. As a result, the receiver may recognize the start of the frame. Subsequently, the receiver may decode data of the preamble and then sequentially decode PLS-pre and PLS-post. DP for normal may be received using frame structure information obtained by decoding PLS-post.

Figure 19:
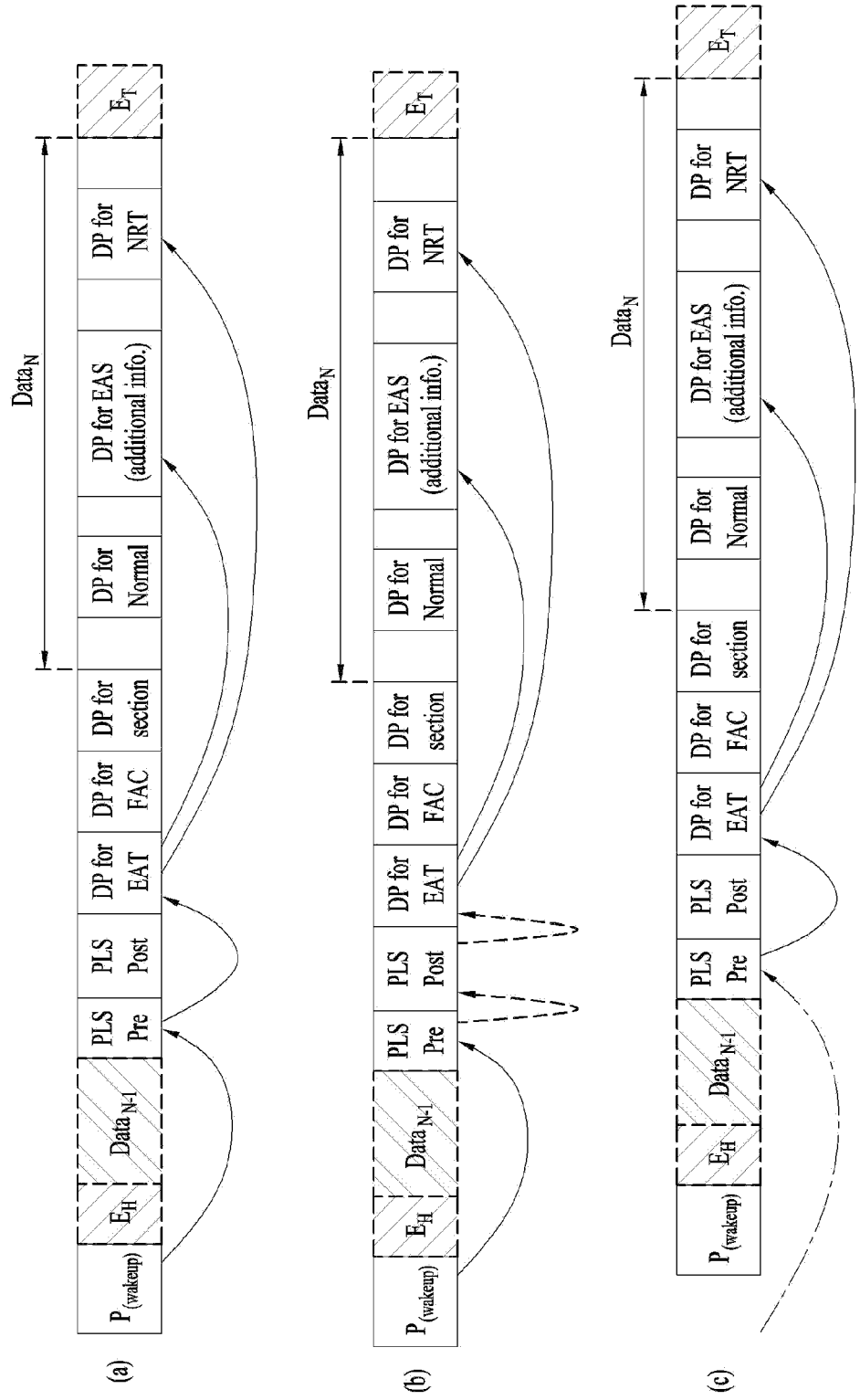
FIG. 19 is a view showing a processing sequence of data related to EAS according to an embodiment of the present invention.

FIG. 19 is a view showing a processing sequence of data related to EAS according to an embodiment of the present invention.

The processing sequence shown in FIG. 19(*a*) may be a processing sequence #1 of data related to EAS during an acquisition process. As previously described, the receiver may detect the preamble first. Subsequently, the receiver may decode data of the preamble and then decode PLS-pre to obtain control information related to DP for EAT. DP for EAT may be decoded using the control information related to DP for EAT.

The processing sequence shown in FIG. 19(*b*) may be a processing sequence #2 of data related to EAS during an acquisition process. In this case, information related to DP for EAT may be located in PLS-post unlike the processing sequence #1 of data related to EAS during the acquisition process. As previously described, PLS-post may include static PLS signaling data and/or dynamic PLS signaling data. The static PLS signaling data may be referred to as PLS2-STAT data. The dynamic PLS signaling data may be referred to as PLS2-DYN data. In a case in which information related to DP for EAT is included in PLS2-STAT, the information may be information that is to be continuously maintained in the super frame including the corresponding frame. That is, the information may be information included in PLS2-STAT of all of the frames in the super frame and information related to information related to EAS of all of the frames in the super frame. In a case in which information related to DP for EAT is included in PLS2-DYN, on the other hand, the information may be information included in only the corresponding frame. In this case, the information may information related to only information related to EAS of the corresponding frame. According to embodiments of the present invention, whether the information related to DP for EAT is included in PLS2-STAT or PLS2-DYN may be decided based on importance of the information related to DP for EAT. The receiver may detect the preamble first to perform an acquisition process. Subsequently, the receiver may decode PLS-pre to obtain information for decoding PLS-post and decode PLS-post using the information. The receiver may obtain information related to DP for EAT by decoding PLS-post. The receiver may receive DP for EAT using the information related to DP for EAT. According to embodiments of the present invention, the information related to DP for EAT may be located in both PLS-pre and PLS-post.

During detection of the preamble, an EAS sequence of the preamble may be detected. The EAS sequence may be a scramble sequence of the preamble to transmit EAS. The EAS sequence may be a scramble sequence used when a preamble to transmit EAS is created. According to embodiments of the present invention, wake_up_indicator as previously described may be located in the EAS sequence. A flowchart showing a data processing procedure will hereinafter be described.

The processing sequence shown in FIG. 19(*c*) may be a processing sequence of data related to EAS in a case in which the receiver is in a normal operation state after the acquisition process. In a case in which the receiver is in a normal operation state, the receiver may process DP for EAT in the previous frame and then decode PLS-pre of the current frame. Subsequently, the receiver may process DP for EAT of the current frame using information obtained by decoding. In a case in which PLS-post has information related to DP for EAT, the receiver may decode PLS-pre and then additionally decode PLS-post to process DP for EAT. Even in a case in which DP for EAT is not present in the previous frame, the receiver may decode PLS-pre of the current frame first to check whether DP for EAT is present in the current frame.

According to embodiments of the present invention, a signaling field informing version information of DP for EAT may be included in PLS-pre or PLS-post. According to embodiments of the present invention, the version information is located in the preamble. The receiver may acquire version information located in PLS-pre or PLS-post to determine whether the version information is the same as the previously obtained version information of EAT. Upon determining that the version information is the same as the previously obtained version information of EAT, the receiver may determine that the information is EAS information regarding the same emergency or the same EAS information and may not decode EAT of DP for EAT. That is, decoding may be performed only in a case in which EAT is a new version in order to reduce burden of the receiver.

Although not shown in the drawing, the receiver may know the position, length, and other information of DP for EAT of the current frame using the previous frame. In this case, the receiver may process the previous frame and then immediately process DP for EAT of the current frame.

A flowchart showing a data processing procedure will hereinafter be described.

Figure 20:
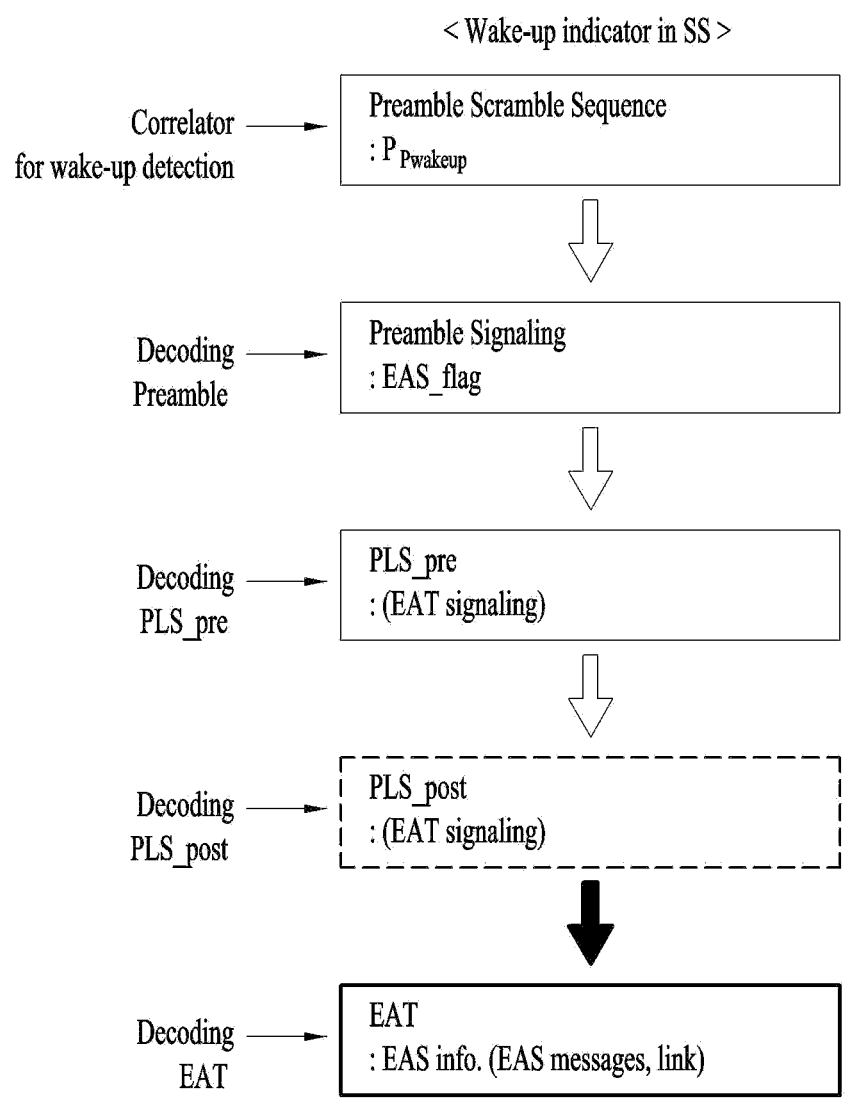
FIG. 20 is a view showing an EAT receiving procedure according to an embodiment of the present invention.

FIG. 20 is a view showing an EAT receiving procedure according to an embodiment of the present invention.

In the EAT receiving procedure shown in FIG. 20, it is assumed that the receiver is in an off state or in a standby mode. The EAT receiving procedure is a wake-up process in which the receiver in the off state or in the standby mode wakes up using wake_up_indicator. Wake up may mean that the receiver in the off state or in the standby mode converts from the off state or the standby mode to a state in which the receiver can receive/process data in order to receive and process data, such as EAS. A wake up indication may be an indication in a time domain.

First, wake_up_indicator may be a signal set when an EAS signal is transmitted as previously described. This may be set by a service provider (for example, a broadcasting corporation). There may be a situation in which it is necessary for the receiver in the off state or in the standby mode to be turned on and inform a user of an emergency situation. Wake_up_indicator may be set such that the receiver can automatically wake up to process an EAS signal in such an emergency situation.

In the emergency situation, wake_up_indicator may be set to an ON state irrespective of frames types of all of the frames. That is, in a case in which it is necessary for the receiver to wake up, wake_up_indicator may be set to an ON state irrespective of frames types of all of the frames. That wake_up_indicator is in the ON state at a specific channel may mean that EAS information is included in the super frame, the frame type set, or the frame of the corresponding channel.

Information that is capable of controlling EAS information may be transmitted to PLS-pre or PLS-post. The control information may be present only in PLS-pre or PLS-post. Alternatively, the control information may be present in both PLS-pre and PLS-post. The information that is capable of controlling EAS information may include a flag, such as EAT_flag, as previously described. As previously described, EAT_flag may be present in a data region of the preamble in addition to PLS-pre/post. In a case in which the information that is capable of controlling EAS information is split and inserted into several frames, PLS-pre or PLS-post may include frame index information for split information.

In the EAT receiving procedure shown in FIG. 20, it is assumed that wake_up_indicator is transmitted using a scramble sequence of the preamble.

First, the receiver may detect a scramble sequence of the preamble using a correlator. Through the detection process, the receiver may check whether the scramble sequence is an EAS sequence, i.e. a scramble sequence for wake_up. In a case in which the scramble sequence is an EAS sequence, the sequence may include wake_up_indicator. In a case in which the scramble sequence is a scramble sequence for wake_up, on the other hand, the receiver may wake up and the EAT receiving procedure may advance to the next step.

The above correlator may detect the preamble through a correlation between scrambling sequences. In addition, the correlator may detect which scrambling sequence the preamble has used. A scrambling sequence having a peak value generated through a correlation process may be a scrambling sequence used in the corresponding preamble. The correlator may be referred to as a preamble detector or a P1 detector.

The correlator may correspond to a preamble detector of the Synchronization & Demodulation module as previously described. As previously described, the preamble detector may detect the preamble. According to embodiments of the present invention, the correlator may correspond to a guard sequence detector of the Synchronization & Demodulation module as previously described. In addition, operation of the correlator may be performed by the Synchronization & Demodulation module channel equalizer as previously described according to embodiments of the present invention.

The receiver may decode a data region of the preamble to check EAT_flag in the preamble. EAT_flag may be a flag indicating whether EAT or DP for EAT is present in the corresponding frame. EAT_flag may be referred to as EAC_flag as previously described. In a case in which EAT_flag is present, the EAT receiving procedure may advance to the next step. According to embodiments of the present invention, EAT_flag may have a size of 1 bit.

The receiver may decode PLS-pre to obtain information that is capable of controlling EAS information. The information that is capable of controlling the EAS information may include EAT_flag. That is, EAT_flag may be present twice in the data region of the preamble and PLS. EAT_flag of PLS may have the same value as EAT_flag of the preamble. The receiver may check EAT_flag of PLS to check whether EAT or DP for EAT is present in the corresponding frame.

According to embodiments of the present invention, the information that is capable of controlling the EAS information may be located in PLS-post. In this case, the receiver may decode PLS-pre to obtain information necessary to decode PLS-post and then decode PLS-post. The receiver may decode PLS-post to obtain the information that is capable of controlling the EAS information, e.g. EAT_flag. That is, EAT_flag may be present twice in the data region of the preamble and PLS as previously described. The receiver may check EAT_flag of PLS to check whether EAT or DP for EAT is present in the corresponding frame. According to embodiments of the present invention, the information that is capable of controlling the EAS information may be located in both PLS-pre and PLS-post.

The receiver may analyze the information that is capable of controlling the EAS information and then decode the EAS information. The EAS information may include EAT, an EAS message, or link information. EAT will hereinafter be described.

Modules/blocks which are capable of performing the respective processes shown in FIG. 20 will hereinafter be described with reference to a flowchart.

Figure 21:
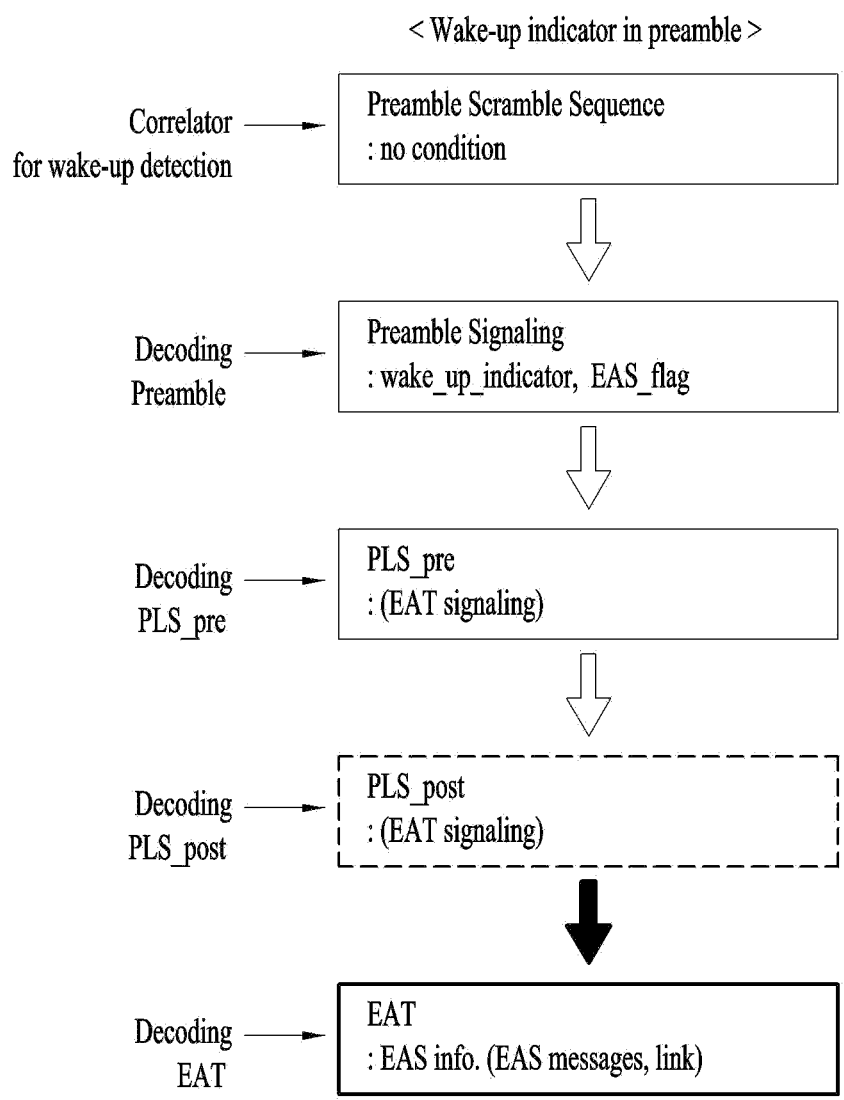
FIG. 21 is a view showing an EAT receiving procedure according to another embodiment of the present invention.

FIG. 21 is a view showing an EAT receiving procedure according to another embodiment of the present invention.

In the EAT receiving procedure shown in FIG. 21, it is assumed that wake_up_indicator is transmitted to the data region of the preamble as a flag unlike the embodiment as previously described The receiver may detect a peak of the preamble through the correlator. As a result, the receiver may detect the preamble.

Subsequently, the receiver may immediately decode the data region of the preamble. The receiver may obtain wake_up_indicator and/or EAT_flag through decoding. The receiver may wake up based on a value of wake_up_indicator. In addition, the receiver may check EAT_flag to check whether EAS information is present in the corresponding frame.

Subsequently, the receiver may decode PLS_pre to analyze information that is capable of controlling the EAS information. As previously described, the information that is capable of controlling the EAS information may be located in PLS_post. The receiver may check the information that is capable of controlling EAS information of PLS, e.g. EAT_flag, and then decode controlling the EAS information.

The receiver may analyze the information that is capable of controlling the EAS information and then decode the EAS information. The EAS information may include EAT, an EAS message, or link information. EAT will hereinafter be described.

Modules/blocks which are capable of performing the respective processes shown in FIG. 21 will hereinafter be described with reference to a flowchart.

Figure 22:
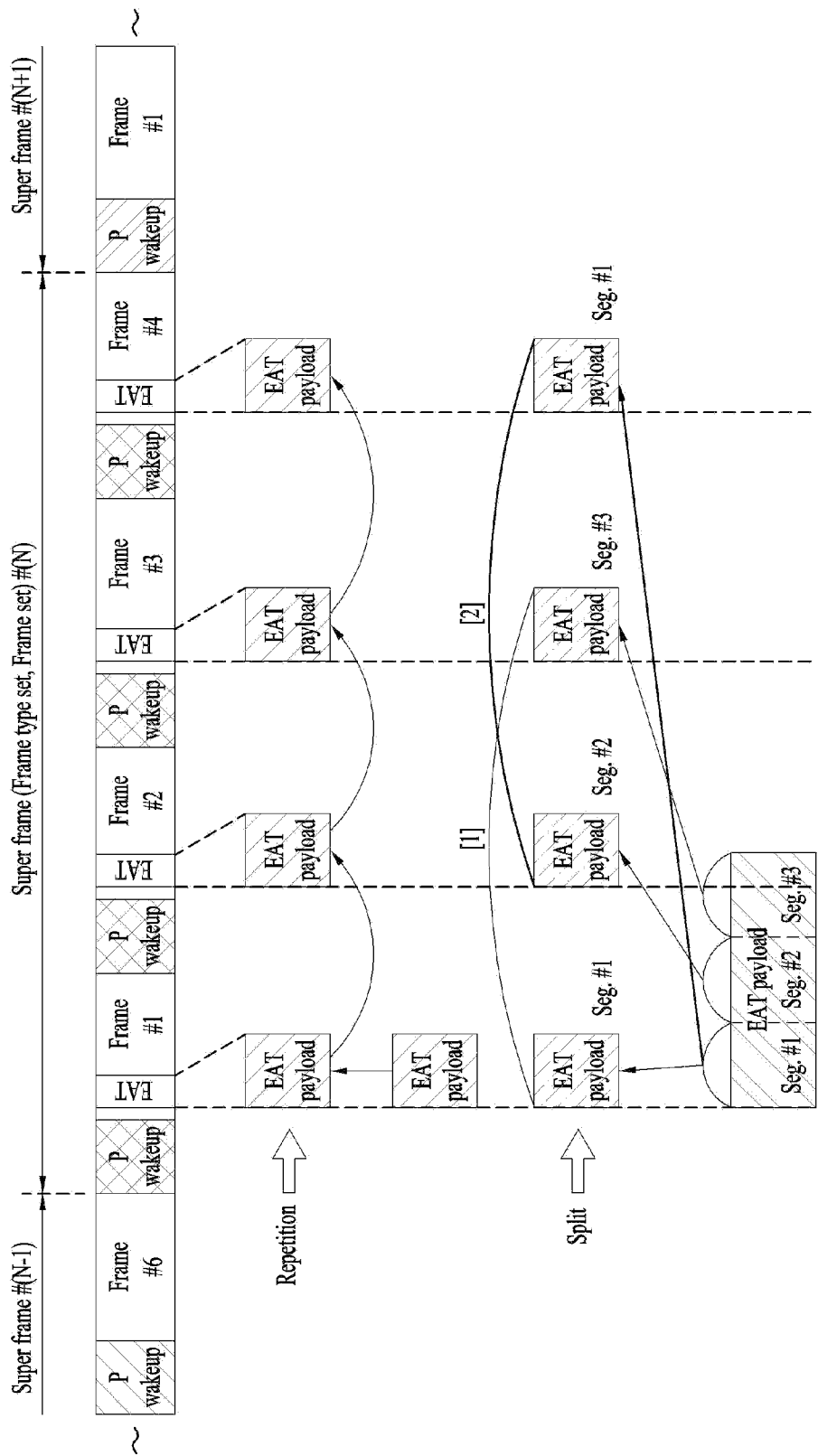
FIG. 22 is a view showing a method of more robustly transmitting EAS information according to an embodiment of the present invention.

FIG. 22 is a view showing a method of more robustly transmitting EAS information according to an embodiment of the present invention.

A part denoted by EAT may mean DP for EAT as previously described. The other signals excluding a preamble and DP for EAT, which are necessary for a description, are omitted from the drawing. In this embodiment, it is assumed that wake_up_indicator is transmitted through a scramble sequence. However, this embodiment may be equally applied to even a case in which wake_up_indicator is transmitted through a data region of the preamble.

In order to more robustly transmit EAS information, the present invention proposes a repetition method and a split method. It is possible to further secure flexibility in scheduling transmission of information using these two methods. Which mode the two methods are applied to a super frame in will hereinafter be described. The two methods may be equally applied to a frame type set or arbitrary frames.

The repetition method will be described.

The repetition method may be a method of repeatedly transmitting EAS information to frames of one super frame or frame type set. According to embodiments of the present invention, EAS information may be repeatedly transmitted to all frames of the super frame or the frame type set or to one or more frames of the super frame or the frame type set. According to embodiments of the present invention, the repetition method may mean a method of repeatedly transmitting EAS information to a plurality of frames irrespective of the super frame and the frame type set. A repetition interval may be changed according to embodiments of the present invention. In one embodiment, a repetition interval of 1 second may be set.

In the repetition method, EAS information may be transmitted in the same mode during one super frame after another super frame in order to improve reliability of reception. Alternatively, EAS information may be transmitted using the repetition method for one super frame and EAS information may be transmitted using the split method, which will hereinafter be described, for another super frame. When EAS information, EAT, or information related to EAS is transmitted, both the repetition method and the split method may be used on a per super frame basis to increase a success rate of reception. In a case in which the number of frames in one super frame is sufficient, the split method may be used and then the split EAS information may be repeatedly transmitted.

The split method will be described.

First, EAS information may be split into an arbitrary number of EAS information segments. Subsequently, the EAS information may be transmitted in a state in which the split EAS information segments are put in DP for EAT of each frame of the super frame. According to embodiments of the present invention, the EAS information may be transmitted in a state in which the EAS information is split and put in all frames of the super frame or the frame type set or in one or frames of the super frame or the frame type set. In the embodiment shown in FIG. 22, EAS information denoted by EAT payload is split into three segments. The respective segments may be transmitted in a state in which the respective segments are put in DP for EAT of the frames in the super frame. A split interval may be changed according to embodiments of the present invention. In one embodiment, a split interval of 1 second may be set.

As in this embodiment, the three split segments may be transmitted in a state in which the three split segments are put in four frames. In this case, the respective segments may be sequentially arranged from the first frame of the super frame. That is, the split EAS information may be arranged in order of seg. #1, seg. #2, and seg. #3.

In a case in which the number of the frames is greater than the number of the segments as in this embodiment, the segments may be repeatedly arranged. That is, seg. #1 may be rearranged in the remaining fourth frame. In a case in which the segments are arranged as described above, it is possible to obtain total EAS information so long as the frames corresponding to the number of segments of the total EAS information are received although reception is started from the middle of the super frame. That is, the EAS information can be received in order of seg. #2, seg. #3, and seg. #1 although reception is started from the second frame and, therefore, it is possible to obtain total EAS information. In this case, it may be necessary to rearrange the order of the respective segments. This advantage may be equally exhibited even in a case in which reception of an arbitrary number of EAS information segments is missed.

The split method may have the following rule.

$$\text{Frame}(n) <= \text{EAT\_segment}(n \% M) \quad \text{[Expression 1]}$$

The above equation may be an equation designating EAS segments transmitted in Frame(n), where n may indicate a frame number in one super frame or one frame type set. That is, Frame(0) may mean the first frame. n may be a natural number from 0 to (N−1). N may be the total number of frames in the corresponding super frame. A % B may indicate the remainder when A is divided by B. EAT_segment(m) may indicate the (m+1)-th EAS information segment. M may be the number of split EAS information segments. According to embodiments of the present invention, in a case in which the total number of frames in the super frame is sufficient, the split segments may be repeatedly transmitted several times. In this case, a rule to designate (allocate) an EAS segment to each frame may be as follows.

$$\text{Frame}(n) <= \text{EAT\_segment}((n \% N) \% M) \quad \text{[Expression 2]}$$

Where n may indicate a frame number in one super frame or one frame type set. That is, Frame(0) may mean the first frame. n may be a natural number from 0 to (L−1). L may be the total number of frames in the corresponding super frame. N may be the number of frames used in split. M may be the number of split EAS information segments. A % B may indicate the remainder when A is divided by B. EAT_segment(m) may indicate the (m+1)-th EAS information segment.

The above split method may be utilized in a case in which the size of the EAS information is large and the repetition method may be more efficiently utilized in a case in which the size of the EAS information is small. The two methods may be used to obtain a diversity gain.

Figure 23:
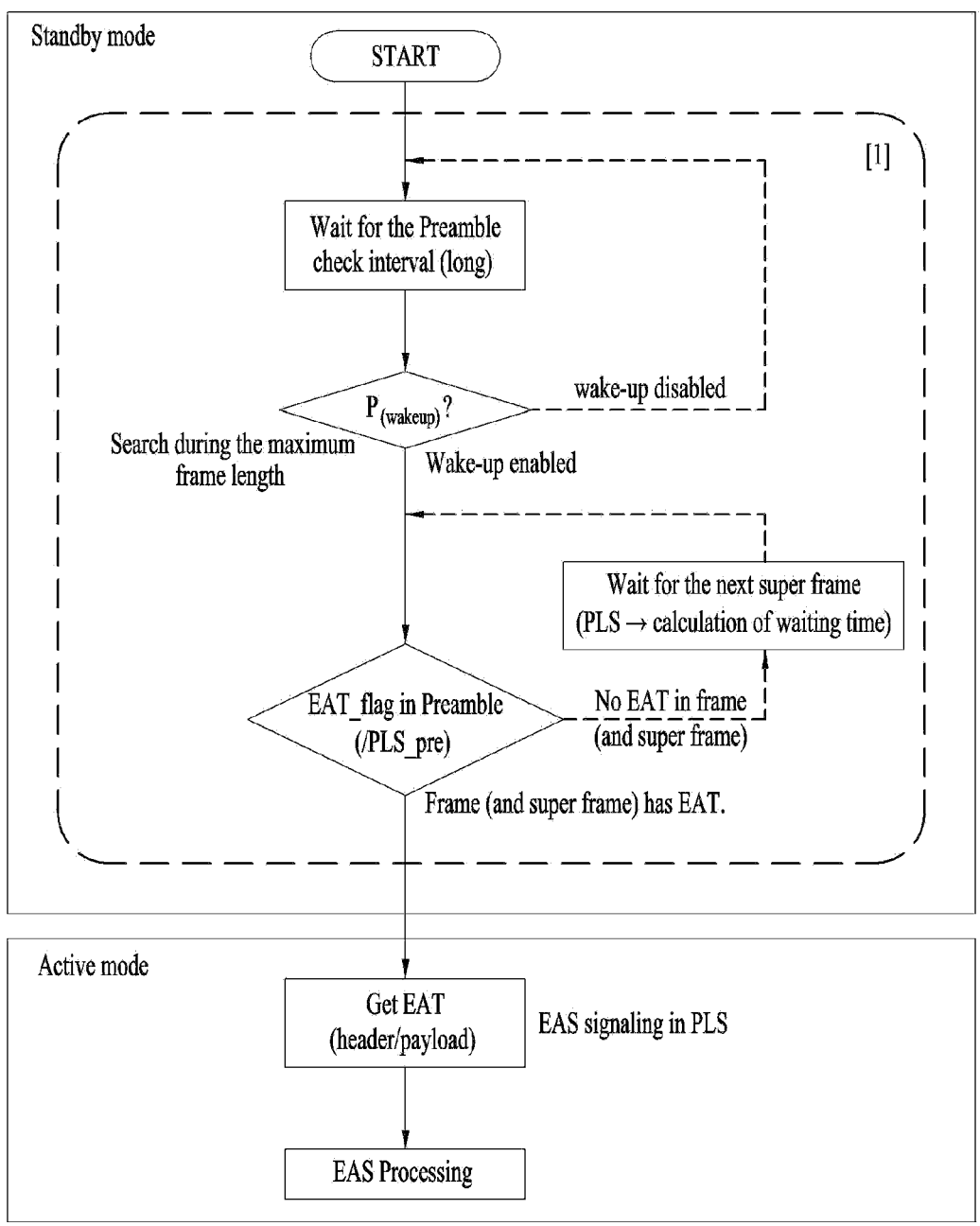
FIG. 23 is a view showing a wake up process of the receiver according to an embodiment of the present invention.

FIG. 23 is a view showing a wake up process of the receiver according to an embodiment of the present invention.

In this embodiment, it is assumed that wake_up_indicator is transmitted through a scramble sequence. However, this embodiment may be similarly applied even to a case in which wake_up_indicator is transmitted through a data region of a preamble.

The receiver may be in two operation modes, such as a standby mode and an active mode. The standby mode may mean a state in which the receiver performs only minimum functions in order to minimize power consumption. The active mode may mean a general operation state in which the receiver receives and processes general service data and/or data related to EAS.

First, the receiver in the standby mode may check a preamble at a preamble check interval. Checking of the preamble may be performed by a preamble detector as previously described. In addition, checking of the preamble may be performed by a guard sequence detector as previously described according to embodiments of the present invention. In a case in which the preamble checked by the receiver is a preamble for wake_up, the procedure may advance to a step of checking EAT_flag present in the preamble and/or PLS. This may be decided based on whether the scramble sequence of the preamble is an EAS sequence, i.e. wake_up_indicator included in the scramble sequence indicates that there is wake up. In this case, which is a case in which the EAS information is present in the corresponding frame, another frame in the corresponding super frame, or another super frame, the receiver may wake up and a process to find the EAS information may be performed. In a case in which the preamble is not a preamble for wake_up, the receiver may not wake up and the procedure may advance to the first step. In this case, functions other than a timer function may be stopped to minimize power consumption until another preamble check interval begins. Checking is performed over the maximum frame length in order not to miss the preamble in the frame. This is because, if checking is performed over a length less than the frame length, the preamble in the frame may be missed.

The receiver may check EAT_flag of the preamble and/or PLS to check whether EAT (or DP for EAT) is present in the corresponding frame. As previously described, EAT_flag may be located in PLS-pre or PLS-post. First, the receiver may check EAT_flag of the data region of the preamble to check whether the corresponding frame has EAS information. Upon checking that corresponding frame has EAS information, the receiver may EAT_flag of PLS-pre or PLS-post again to check whether the corresponding frame has EAS information once more. According to embodiments of the present invention, in a case in which the receiver checks EAT_flag of the preamble to check that the corresponding frame does not have EAS information, EAT_flag of PLS may not be checked. Checking of EAT_flag located in the preamble may be performed by the preamble detector as previously described. As previously described, the preamble detector may decode data of the preamble to obtain EAT_flag. EAT_flag located in the PLS region may be obtained by the output processor as previously described. Data of the PLS region may be transmitted to the output processor via the frame parsing mode and the demapping & decoding module as previously described. The output processor may restore PLS data and transmit the restored PLS data to the system controller as described above. At this time, EAT_flag information of the restored PLS region may also be transmitted to the system controller to inform of whether EAT is present in the corresponding frame. According to embodiments of the present invention, information related to presence or absence of EAT may be transmitted to the preamble detector of the receiver.

In a case in which EAS information is present in the corresponding frame, the receiver may perform EAS processing. The EAS processing may be decoding of the EAS information. The decoding of the EAS information may be obtaining EAT and decoding of the obtained EAT. As previously described, information that is capable of obtaining the EAS information may be located in PLS. EAT may be obtained from DP for EAT.

Decoding of DP for EAT may be performed by an EAC decoding block. According to embodiments of the present invention, the EAC decoding block may be present separately from the previously introduced blocks. For example, the EAC decoding block may be located in the synchronization & demodulation module as previously described. In addition, the EAC decoding block may be located in the demapping & decoding module as previously described or in the output processor as previously described. In addition, the EAC decoding block may correspond to one of the previously introduced blocks according to embodiments of the present invention. For example, the EAC decoding block may correspond to blocks that perform PLS decoding in the frame parsing module, the demapping & decoding module, and the output processor as previously described. In this case, DP for EAT may be decoded by the blocks that perform PLS decoding. Alternatively, the EAC decoding block may correspond to blocks that perform general DP decoding in the frame parsing module, the demapping & decoding module, and the output processor as previously described. In this case, DP for EAT may be decoded by the blocks that perform DP decoding. Alternatively, the EAC decoding block may correspond to one of the blocks of the synchronization & demodulation module as previously described.

Decoding of logical channels containing additional information, such as DP for EAS and DP for NRT, indicated by DP for EAT may be performed by an EAS decoding block. According to embodiments of the present invention, the EAS decoding block may be present separately from the previously introduced blocks. For example, the EAS decoding block may be located in one selected from among the synchronization & demodulation module, the demapping & decoding module, and the output processor as previously described. In one embodiment, the EAS decoding block may correspond to one of the previously introduced blocks. For example, the EAS decoding block may correspond to blocks that perform PLS decoding as previously described. In this case, additional information may be decoded by the blocks that perform PLS decoding. Alternatively, the EAS decoding block may correspond to blocks that perform general DP decoding. In this case, the additional information may be decoded by the blocks that perform DP decoding.

In a case in which EAS information is not present in the corresponding frame, the receiver may determine that EAS information is not present in the corresponding frame or the corresponding super frame and may wait for reception of the next frame or the next super frame. The receiver may wait for the next super frame and then check EAT_flag again based on information related to the super frame obtained from PLS.

Figure 24:
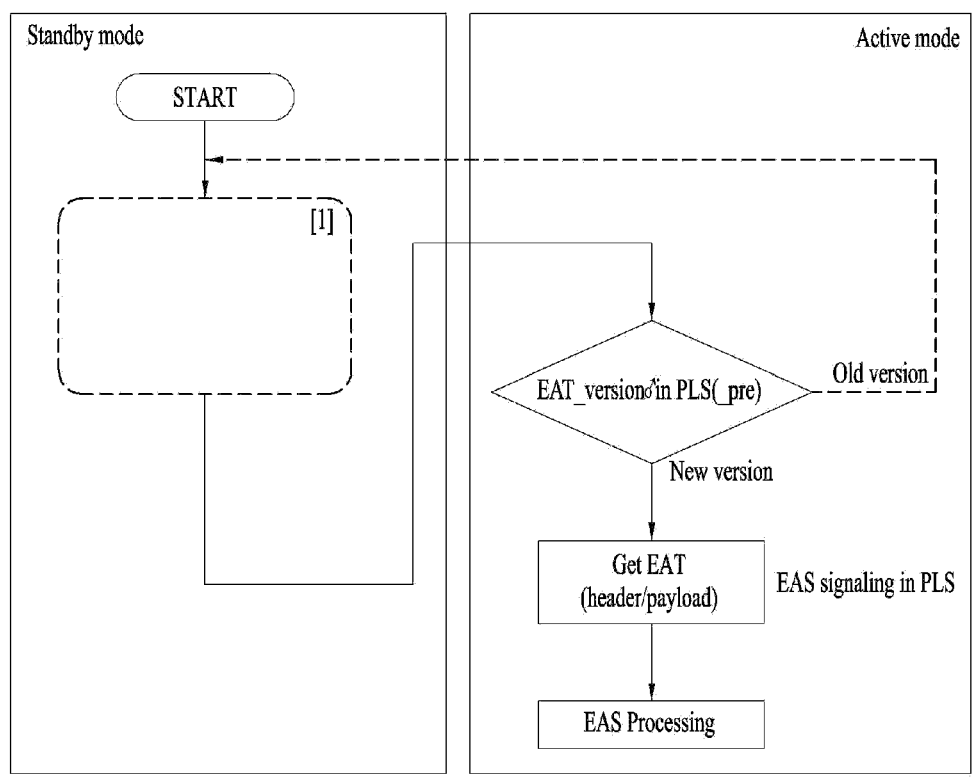
FIG. 24 is a view showing a versioning procedure of EAS according to an embodiment of the present invention.

FIG. 24 is a view showing a versioning procedure of EAS according to an embodiment of the present invention.

In this embodiment, it is assumed that wake_up_indicator is transmitted through a scramble sequence. However, this embodiment may be similarly applied even to a case in which wake_up_indicator is transmitted through a data region of a preamble.

Part [1] indicated by a dotted line, which is the same as part [1] indicated by a dotted line in FIG. 23, is omitted from the drawing. Operation of Part [1] may be performed in the same manner as in the above description made with reference to FIG. 23.

In a case in which a wake up indication for a specific emergency situation is dismissed by a user, the receiver may decide whether a wake up indication for another emergency situation that is subsequently received is to be ignored. To this end, version information of EAS may be used. EAS versioning will hereinafter be described in detail.

In this embodiment, the receiver may be in a state in which the receiver dismisses a specific version of wake up indication and returns to a standby mode. Dismissing of the wake up indication may be performed by the user or setup of the receiver. Subsequently, the receiver may receive EAS information through the process of [1]. In a case in which the receiver obtains information indicating that the corresponding frame is a frame having the EAS information present therein through the process of [1], the receiver may check version of the EAS information. The version of the EAS information may mean version of wake up.

The receiver checks the version of the EAS information. Version information of the EAS information may be present in PLS. According to embodiments of the present invention, the version information of the EAS information may be present in PLS-pre or PLS-post. The receiver checks whether the version of the current EAS information or wake up indication is the same as the version of the previously dismissed EAS information or wake up indication through the version information. Upon checking that the version of the current EAS information or wake up indication corresponds to a previous version of the EAS information or wake up indication, the receiver may return to the first step and enter a standby mode. As a result, the receiver may not decode the EAS information. Upon checking that the version of the current EAS information or wake up indication corresponds to a new version of the EAS information or wake up indication, on the other hand, the receiver may decode the EAS information.

According to embodiments of the present invention, this version information may be obtained by the output processor as previously described. Data of the PLS region may be transmitted to the output processor via the frame parsing module and the demapping & decoding module as previously described. The output processor may restore PLS data and transmit the restored PLS data to the system controller as described above. At this time, version information of the restored PLS region may also be transmitted to the system controller to inform of whether EAT is present in the corresponding frame. According to embodiments of the present invention, this version information may be transmitted to the preamble detector of the receiver.

Figure 25:
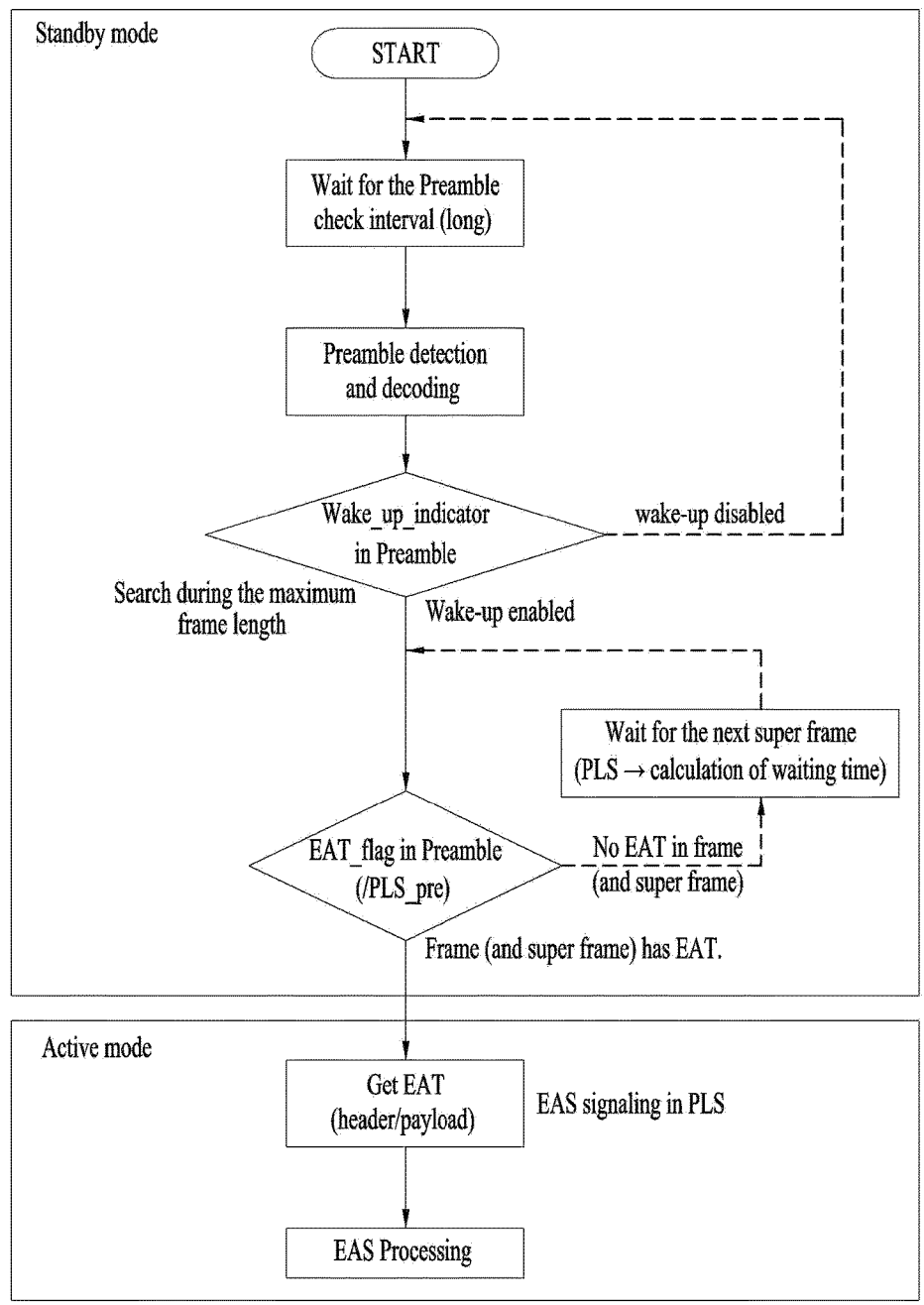
FIG. 25 is a view showing a wake up process of the receiver according to another embodiment of the present invention.

FIG. 25 is a view showing a wake up process of the receiver according to another embodiment of the present invention.

In this embodiment, it is assumed that wake_up_indicator is transmitted through a data region of a preamble.

Processes of this embodiment may be performed by the same block/module as the block/module performing the processes of the previous embodiment. Wake_up_indicator in the data region of the preamble may be decoded by the preamble detector in the same manner as the above description.

First, the receiver in the standby mode may check a preamble at a preamble check interval. Checking of the preamble may be performed by a preamble check block, which is turned on at the preamble check interval, as previously described. In a case in which the preamble is detected, the data region of the preamble may be decoded. The receiver may check wake_up_indicator of the data region of the preamble.

In a case in which wake_up_indicator indicates that there is no wake up, wake up does not occur. At this time, the receiver may return to the first step and enter a standby mode until another preamble check interval begins. The receiver in the standby mode may stop functions other than a timer function to minimize power consumption.

In a case in which wake_up_indicator indicates that there is wake up, on the other hand, the receiver may check EAT_flag of the preamble and/or PLS. As previously described, EAT_flag may be located in PLS-pre and/or PLS-post.

Upon checking that EAS information is present in the frame as the result of checking EAT_flag, the receiver may perform EAS processing. The EAS processing may mean decoding of the EAS information. The decoding of the EAS information may be obtaining EAT and decoding of the obtained EAT. As previously described, information that is capable of obtaining the EAS information may be located in PLS.

In a case in which EAS information is present in the corresponding frame, on the other hand, the receiver may determine that EAS information is not present in the corresponding frame or the corresponding super frame and may wait for reception of the next frame or the next super frame. The receiver may wait for the next super frame and then check EAT_flag again based on information related to the super frame obtained from PLS.

Figure 26:
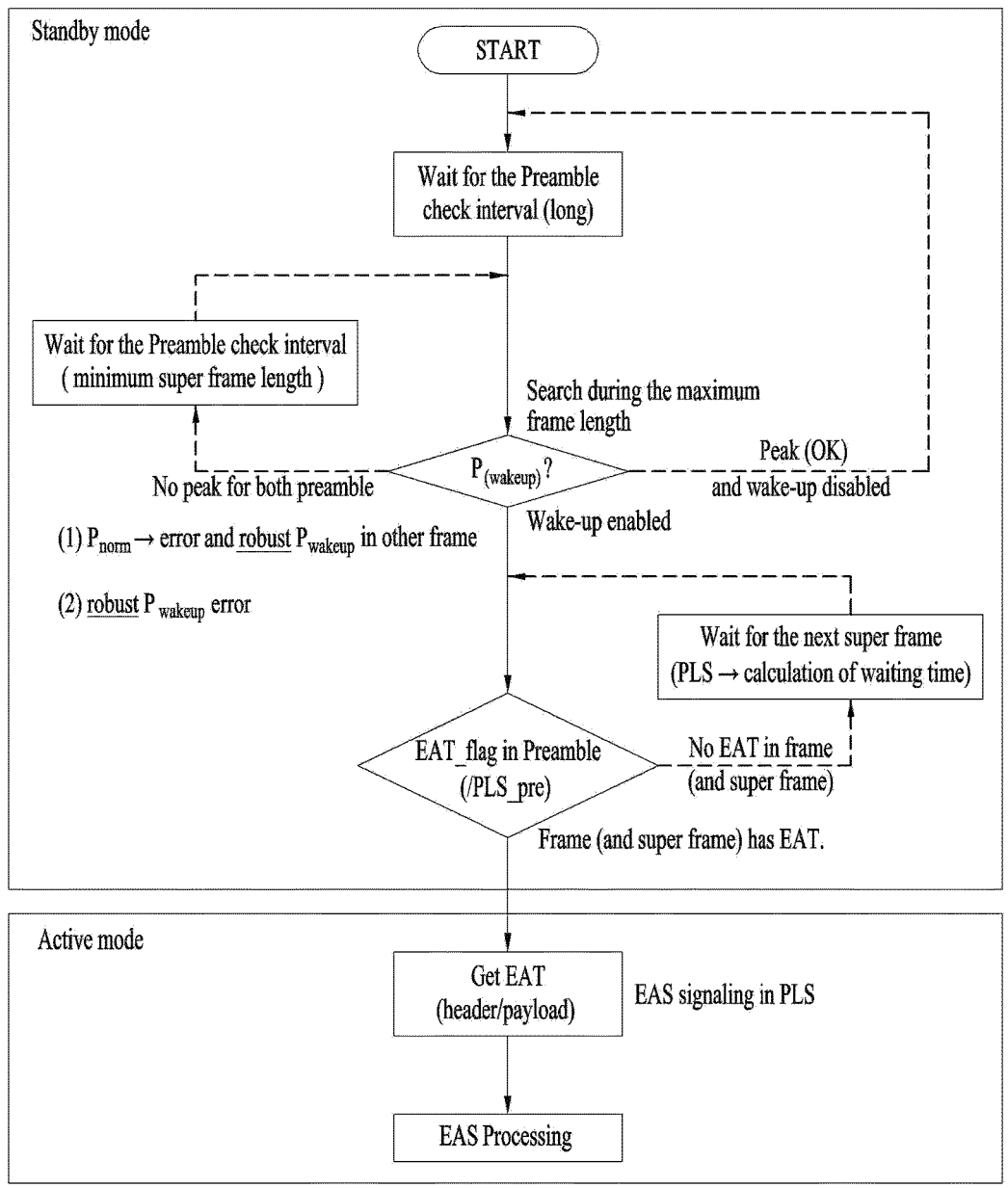
FIG. 26 is a view showing a wake up process of the receiver according to a further embodiment of the present invention.

FIG. 26 is a view showing a wake up process of the receiver according to a further embodiment of the present invention.

In this embodiment, it is assumed that wake_up_indicator is transmitted through a scramble sequence. However, this embodiment may be similarly applied even to a case in which wake_up_indicator is transmitted through a data region of a preamble.

Processes of this embodiment may be performed by the same block/module as the block/module performing the processes of the previous embodiment.

In this embodiment, two types of preambles having different performances may be used unlike the previous embodiments. That is, in this embodiment, a robust preamble may be used for a super frame including EAS information and a normal preamble may be used for a super frame not including EAS information. As previously described, the robust preamble may be a preamble having higher detection and decoding performances than the normal preamble.

In this embodiment, processes after checking EAT_flag of the preamble and/or PLS may be the same as the processes of the previous embodiment and, therefore, a description thereof will be omitted.

First, the receiver may check a preamble at a preamble check interval as previously described. The receiver may check wake_up_indicator of a scramble sequence. In a case in which there is no wake up, the receiver may return to the first step and enter a standby mode. In a case in which there is wake up, on the other hand, the receiver may check EAT_flag of the preamble and/or PLS. In a case in which EAS information is present, the receiver may decode the EAS information.

In a case in which the receiver has not detected both the normal preamble and the robust preamble, the receiver may not know whether there is wake up. In this case, wake up may be missed in an emergency situation with the result that EAS message not be transmitted to a user.

In order to prevent the occurrence of the above situation, in a case in which both the normal preamble and the robust preamble are not detected, the receiver may check a preamble of the next super frame to check whether there is wake up. In this case, the receiver may not know the length of the super frame. Consequently, the receiver may wait for the minimum length of the super frame suggested by a corresponding transmission technology and then check the preamble. This is because, if the receiver waits for a longer length, one super frame may be entirely missed. This process may be repeated until it is checked whether a wake up indication is present. This process may also be performed by the preamble detector as previously described.

In a case in which a wake up indication is not present as the result of checking, the receiver may wait for an arbitrary long preamble check interval which has been reset. In a standby mode, the receiver may stop some functions to minimize power consumption.

FIG. 27 is a view showing EAT information according to an embodiment of the present invention.

As previously described, EAT may include information related to EAS. In a case in which EAS processing is performed as previously described, EAT may be acquired and decoded to obtain EAS information related to a real emergency situation. According to embodiments of the present invention, EAT may be transmitted through DP for EAT. As previously described, DP for EAT may be referred to as EAC. EAC may include a core text message or a table. EAC may include information related to the core text message. In addition, EAC may include flag information indicating whether additional information related to EAS is present and information indicating which DP transmits additional information related to EAS.

EAT may include a plurality of EAS messages. Each EAS message may include message identification (ID), version information, and an IP/TS indicator, and an RT/NRT indicator. The respective EAS messages may not be simultaneously transmitted through IP or TS. That is, all of the EAS messages may be transmitted through IP or TS in one super frame. An EAT indicator may include length and size information of each message. This is because it is necessary to restrict the size of each EAS message in one frame.

A table provided below may be a table defining fields of a preamble, PLS-pre, and PLS-post for EAS transmission. As previously described, PLS-pre and PLS-post may be referred to as PLS1 and PLS2, respectively. This table is based on one embodiment of the present invention and may be changed according to the intention of a designer.

TABLE 1

| ◆ Preamble | |
|---|---|
| EAC_flag | 1 bit |
| ◆ PLS-pre | |
| No field for EAS in PLS-pre | |
| ◆ PLS-post | |
| EAC_flag | 1 bit |
| EAT_version | 14 bits |
| EAT_N_RB | 8 bits |
| EAT_repeat_mode | 3 bits |
| EAT_split_mode | 3 bits |
| EAT_split_index | 3 bits |

As described above, EAT_flag is located in the preamble. As previously described, EAT_flag may be referred to as EAC_flag. EAT_flag may indicate whether EAS information is present in the current frame. The EAS information may mean EAC.

As described in the previous embodiment, EAT_flag information may be located in PLS-pre or PLS-post. In the embodiment based on this table, EAT_flag (EAC_flag) may be present in PLS-post. According to embodiments of the present invention, information related to EAS may not be present in PLS-pre.

PLS-post may include EAC_flag, EAT_version, EAT_N_RB, EAT_repeat_mode, EAT_split_mode, and/or EAT_split_index.

As previously described, EAC_flag may be a flag indicating whether EAS information or DP for EAT is present in the corresponding frame. EAT_version may be information indicating version of EAT. EAT_version may correspond to version information of EAS information in EAS versioning as previously described. EAT_N_RB may mean the number of resource blocks of EAT.

EAT_repeat_mode may be a field related to the repetition method as previously described. In a case which a value of this field is 0, it may mean that DP for EAT is not present. In a case which a value of this field is 1, it may mean that EAS information has not been repeated. In a case which a value of this field is between 2 and 7, it may mean that EAS information has been repeated and inserted twice to 7 times.

EAT_split_mode may be a field related to the split method as previously described. In a case which a value of this field is 0, it may mean that DP for EAT is not present. In a case which a value of this field is 1, it may mean that EAS information has not been split. In a case which a value of this field is between 2 and 7, it may mean that EAS information has been split and inserted twice to 7 times.

EAT_split_index, which is a field related to the split method as previously described, may mean index information of EAS information split and inserted into a corresponding frame. In a case which a value of this field is 0, it may mean that DP for EAT is not present. In a case which a value of this field is between 1 and 7, it may mean that an index of the split EAS information in the corresponding frame has a value of 1 to 7. That is, EAT_split_index may mean a segment index of the split EAS information. In a case which a value of this field is 1, it may mean that EAS information has not been split according to embodiments of the present invention.

In a case in which EAC_flag indicates that EAS information is present in the corresponding frame, an EAT_version field may be used as EAC_frame_counter according to embodiments of the present invention. EAC_frame_counter, which is a down counter, may indicate that a frame having EAS information will be appear soon as a value of EAC_frame_counter is reduced by one. In a case in which a value of the counter is 0, it may be indicated that the corresponding frame is a frame having EAS information. In addition, bits of the other fields excluding EAC_flag may be used as EAC_fream_counter as previously described. Even in this case, it may be indicated that the corresponding frame is a frame having EAS information in a case in which a value of the counter is 0.

Figure 28:
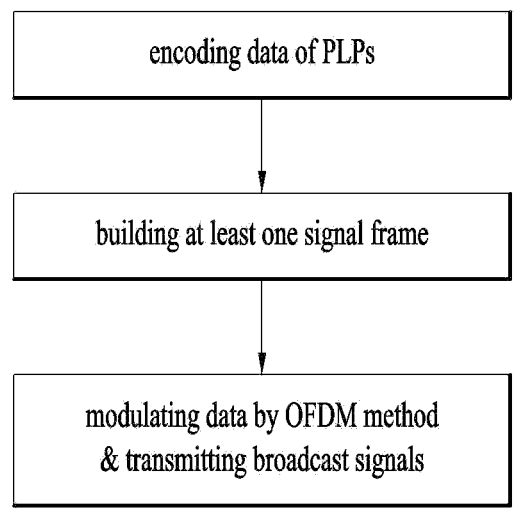
FIG. 28 illustrates a method of providing an emergency alert via broadcast signal transmission according to an embodiment of the present invention.

FIG. 28 illustrates a method of providing an emergency alert via broadcast signal transmission according to an embodiment of the present invention.

The method of providing an emergency alert can includes encoding data of PLPs, building at least one signal frame and/or modulating data by OFDM method & transmitting broadcast signals.

In step of the encoding data of PLPs, the above described coding & modulation module may encode data of the PLPs. The PLP can be also referred to as DP. This step can include LDPC (Low Density Parity Check) encoding, bit interleaving, mapping onto constellations, MIMO (Multi Input Multi Output) encoding, and/or time interleaving. The data in in each data path can be encoded based on a code rate.

The encoding with LDPC codes may correspond to LDPC encoding by LDPC encoder. The LDPC encoder may encode BB frames in the PLPs with LDPC codes. Bit interleaving may correspond to bit interleaving by bit interleaver. Constellation mapping may correspond to the constellation mapping conducted by constellation mapper. MIMO encoding can refer to MIMO encoding performed by above described MIMO encoder. Time interleaving can correspond to time interleaving by time interleaver.

In step of the building at least one signal frame, the above-described frame structure module can build signal frames by mapping the encoded data of the PLPs.

In step of modulating data by OFDM method & transmitting broadcast signals, the above-dsecribed waveform generation module can modulate data in OFDM method, and transmit the broadcast signals.

In this embodiment of method of providing an emergency alert, the signal frame can include a preamble generated by using an EAS (Emergency Alert System) sequence. The EAS sequence provides signaling about the emergency. The EAS sequence may corresponds to scrambling sequence which signals that the emergency is upcoming and that when/whether the receiver should wake up.

In a method of providing an emergency alert according to other embodiment of the present invention, the preamble provides a first signaling information to indicate when a receiver in a stand-by mode wakes up. Specifically, either the sequence in the preamble or the data of the preamble may provide such indication, depends on embodiments. The first signaling information may corresponds to information for waking up the receiver.

In a method of providing an emergency alert according to another embodiment of the present invention, the EAS sequence of the preamble includes the first signaling information. This embodiment may refer to the case when the sequence in the preamble provides wake up indication.

In a method of providing an emergency alert according to another embodiment of the present invention, the preamble further includes a second signaling information indicating whether EAS data is provided in the current signal frame. The second signaling information may correspond to EAC_flag in the preamble. The EAS data includes information about the emergency. The EAS data may correspond to EAC or additional information of emergency.

In a method of providing an emergency alert according to another embodiment of the present invention, the signal frame further includes physical layer signaling data having signaling information for the data of the PLPs. The physical layer signaling data may correspond to PLS field in the signal frame. Physical layer signaling data may correspond to either PLS-pre or PLS-post, depends on embodiments. The physical layer signaling data can include a third signaling information indicating existence of the EAS data in the current signal frame. The third signaling information may correspond to EAC_flag in the PLS data. In one embodiment, EAC_flag may be located in PLS-post. The third signaling information has the same value as the second signaling information. EAC_flag in preamble and EAC_flag in PLS may have same value, as described above.

In a method of providing an emergency alert according to another embodiment of the present invention, the signal frame further includes a version information indicating version of the emergency alert. The version information can be above described version information in PLS. The version information can be used for wake up versioning, as described above. The versioing process and how the receiver can choose to decode EAS information or not are described above.

The above-described steps can be omitted or replaced by steps executing similar or identical functions according to design.

Figure 29:
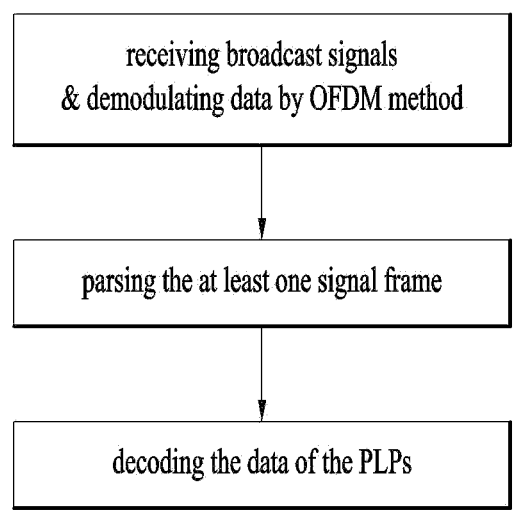
FIG. 29 illustrates a method of providing an emergency alert via broadcast signal reception according to an embodiment of the present invention.

FIG. 29 illustrates a method of providing an emergency alert via broadcast signal reception according to an embodiment of the present invention.

The method includes receiving broadcast signals & demodulating data by OFDM method, parsing the at least one signal frame and/or decoding the data of the PLPs.

In step of receiving broadcast signals & demodulating data by OFDM method, the above-described synchronization & demodulation module receives broadcast signals, and demodulates data by OFDM method.

In step of parsing the at least one signal frame, the above-described frame parsing module parses the signal frame by demapping data of the PLPs.

In step of decoding the data of the PLPs, the above-described demapping & decoding module decodes the PLP data. Step of decoding the PLP data can include time deinterleaving, MIMO (Multi Input Multi Output) decoding, and so on.

In step of time deinterleaving, the above-described time deinterleaver can conduct time deinterleaving PLP data. In step of MIMO decoding, the above-described MIMO decoder can conduct MIMO decoding PLP data. MIMO decoding can be conducted by using MIMO matrix including MIMO coefficient. MIMO coefficient can be used for adjusting power imbalance. In step of demapping from constellations, the above-described constellation demapper can conduct demapping. The demapping can be conducted on PLP data. In step of bit deinterleaving, the above-described bit deinterleaver can conduct bit deinterleaving. In step of LDPC decoding. the above-described LDPC decoder (or FEC decoder) can decode PLP data according to LDPC code, to output BB frames.

In this embodiment of method of providing an emergency alert, the signal frame can include a preamble generated by using an EAS (Emergency Alert System) sequence. The EAS sequence provides signaling about the emergency. The EAS sequence may corresponds to scrambling sequence which signals that the emergency is upcoming and that when/whether the receiver should wake up.

In a method of providing an emergency alert according to other embodiment of the present invention, the preamble provides a first signaling information to indicate when a receiver in a stand-by mode wakes up. Specifically, either the sequence in the preamble or the data of the preamble may provide such indication, depends on embodiments. The first signaling information may corresponds to information for waking up the receiver.

In a method of providing an emergency alert according to another embodiment of the present invention, the EAS sequence of the preamble includes the first signaling information. This embodiment may refer to the case when the sequence in the preamble provides wake up indication.

In a method of providing an emergency alert according to another embodiment of the present invention, the preamble further includes a second signaling information indicating whether EAS data is provided in the current signal frame. The second signaling information may correspond to EAC_flag in the preamble. The EAS data includes information about the emergency. The EAS data may correspond to EAC or additional information of emergency.

In a method of providing an emergency alert according to another embodiment of the present invention, the signal frame further includes physical layer signaling data having signaling information for the data of the PLPs. The physical layer signaling data may correspond to PLS field in the signal frame. Physical layer signaling data may correspond to either PLS-pre or PLS-post, depends on embodiments. The physical layer signaling data can include a third signaling information indicating existence of the EAS data in the current signal frame. The third signaling information may correspond to EAC_flag in the PLS data. In one embodiment, EAC_flag may be located in PLS-post. The third signaling information has the same value as the second signaling information. EAC_flag in preamble and EAC_flag in PLS may have same value, as described above.

In a method of providing an emergency alert according to another embodiment of the present invention, the signal frame further includes a version information indicating version of the emergency alert. The version information can be above described version information in PLS. The version information can be used for wake up versioning, as described above. The versioing process and how the receiver can choose to decode EAS information or not are described above.

The above-described steps can be omitted or replaced by steps executing similar or identical functions according to design.

Although the description of the present invention is explained with reference to each of the accompanying drawings for clarity, it is possible to design new embodiment(s) by merging the embodiments shown in the accompanying drawings with each other. And, if a recording medium readable by a computer, in which programs for executing the embodiments mentioned in the foregoing description are recorded, is designed in necessity of those skilled in the art, it may belong to the scope of the appended claims and their equivalents.

An apparatus and method according to the present invention may be non-limited by the configurations and methods of the embodiments mentioned in the foregoing description. And, the embodiments mentioned in the foregoing description can be configured in a manner of being selectively combined with one another entirely or in part to enable various modifications.

In addition, a method according to the present invention can be implemented with processor-readable codes in a processor-readable recording medium provided to a network device. The processor-readable medium may include all kinds of recording devices capable of storing data readable by a processor. The processor-readable medium may include one of ROM, RAM, CD-ROM, magnetic tapes, floppy discs, optical data storage devices, and the like for example and also include such a carrier-wave type implementation as a transmission via Internet. Furthermore, as the processor-readable recording medium is distributed to a computer system connected via network, processor-readable codes can be saved and executed according to a distributive system.

It will be appreciated by those skilled in the art that various modifications and variations can be made in the present invention without departing from the spirit or scope of the inventions. Thus, it is intended that the present invention covers the modifications and variations of this invention provided they come within the scope of the appended claims and their equivalents.

Both apparatus and method inventions are mentioned in this specification and descriptions of both of the apparatus and method inventions may be complementarily applicable to each other.

Various embodiments have been described in the best mode for carrying out the invention.

The present invention has industrial applicability in broadcasting and communication field.

What is claimed is:

1. A method of providing an emergency alert via broadcast signal transmission, the method including:
    encoding data of PLPs (Physical Layer Pipes) with LDPC (Low Density Parity Check) codes;
    bit interleaving the LDPC encoded data of the PLPs;
    mapping the bit interleaved data onto constellations;
    time interleaving the mapped data;
    building at least one signal frame by mapping the time interleaved data; and
    modulating data in the built signal frame by OFDM (Orthogonal Frequency Division Multiplexing) method,
    combining a first sequence and a second sequence for generating a preamble symbol;
    inserting the generated preamble symbol in the at least one signal frame at a beginning of each of the at least one signal frame after the OFDM modulating data in the at least one signal frame; and
    transmitting broadcast signals having the at least one signal frame,
    wherein wake up information is transmitted in the preamble symbol.

2. The method of claim 1, wherein the wake up information is detected by a receiver being in a standby mode.

3. The method of claim 2, wherein the wake up indicator indicates whether EAS information is provided in the at least one signal frame.

4. The method of claim 1, wherein the preamble symbol is generated by using an EAS sequence and the EAS sequence includes a first signaling information.

5. The method of claim 1, wherein the preamble symbol includes a version information.

6. A method of providing an emergency alert via broadcast signal reception, the method including:
    receiving broadcast signals having at least one signal frame;
    detecting a preamble symbol at a beginning of each of the at least one signal frame, wherein the preamble symbol includes a combination of a first sequence and a second sequence,
    demodulating data in the at least one signal frame by an OFDM (Orthogonal Frequency Division Multiplexing) method;
    parsing the at least one signal frame by demapping data of PLPs (Physical Layer Pipes);
    time deinterleaving the data of the PLPs, wherein one of the PLPs includes information for rapid channel scanning and service acquisition, and the information is signaled by signaling information included in the at least one signal frame;
    demapping the time deinterleaved data from constellations;
    bit deinterleaving the demapped data; and
    decoding the bit deinterleaved data with LDPC (Low Density Parity Check) codes,
    wherein wake up information is received in the preamble symbol.

7. The method of claim 6, wherein the wake up information is detected by a receiver being in a standby mode.

8. The method of claim 7, wherein the wake up indicator indicates whether EAS information is provided in the at least one signal frame.

9. The method of claim 6, wherein the preamble symbol is generated by using an EAS sequence and the EAS sequence includes a first signaling information.

10. The method of claim 6, wherein the preamble symbol includes a version information.

11. An apparatus for providing an emergency alert via broadcast signal transmission, the apparatus including:
- a LDPC (Low Density Parity Check) encoder to encode data of PLPs (Physical Layer Pipes) with LDPC codes;
- a bit interleaver to bit interleave the LDPC encoded data of the PLPs;
- a constellation mapper to map the bit interleaved data onto constellations;
- a time interleaver to time interleave the mapped data;
- a frame builder to build at least one signal frame by mapping the time interleaved data;
- an OFDM (Orthogonal Frequency Division Multiplexing) modulator to modulate data in the built at least one signal frame by an OFDM method;
- a preamble inserter to combine a first sequence and a second sequence for generating a preamble symbol and to insert the generated preamble symbol at a beginning of each of the at least one signal frame after the data in the at, least one signal frame is OFDM modulated; and
- a transmitter to transmit broadcast signals having the at least one signal frame, wherein wake up information is transmitted in the preamble symbol.

12. The apparatus of claim 11,
wherein the wake up information is detected by a receiver being in a standby mode.

13. The apparatus of claim 12, wherein the wake up indicator indicates whether EAS information is provided in the at least one signal frame.

14. The apparatus of claim 11, wherein the preamble symbol is generated by using an EAS sequence and the EAS sequence includes a first signaling information.

15. The apparatus of claim 11, wherein the preamble symbol includes a version information.

16. An apparatus of providing an emergency alert via broadcast signal reception, the apparatus including:
- a receiver to receive broadcast signals having at least one signal frame;
- a preamble detector to detect a preamble symbol at a beginning of each of the at least one signal frame, wherein the preamble symbol includes a combination of a first sequence and a second sequence;
- an OFDM (Orthogonal Frequency Division Multiplexing) demodulator to demodulate data in the at least one signal frame by an OFDM method;
- a frame parser to parse the at least one signal frame by demapping data of PLPs (Physical Layer Pipes), wherein one of the PLPs includes information for rapid channel scanning and service acquisition, and the information is signaled by signaling information included in the signal frame;
- a time deinterleaver to time deinterleave the data of the PLPs;
- a constellation demapper to demap the time deinterleaved data from constellations;
- a bit deinterleaver to bit deinterleave the demapped data; and
- a LDPC (Low Density Parity Check) decoder to decode the bit deinterleaved data with LDPC codes, wherein wake up information is received in the preamble symbol.

17. The apparatus of claim 16,
wherein the wake up information is detected by a receiver being in a standby mode.

18. The apparatus of claim 17, wherein the wake up indicator indicates whether EAS information is provided in the at least one signal frame.

19. The apparatus of claim 16, wherein the preamble symbol is generated by using an EAS sequence and the EAS sequence includes a first signaling information.

20. The apparatus of claim 16, wherein the preamble symbol includes a version information.

* * * * *